(12) United States Patent
Grubert et al.

(10) Patent No.: US 10,082,000 B2
(45) Date of Patent: Sep. 25, 2018

(54) APPARATUS AND METHOD FOR ISOLATING FLUID FLOW IN AN OPEN HOLE COMPLETION

(71) Applicants: Marcel A. Grubert, Montgomery, TX (US); David E. Courtnage, St. Marys (CA); Jing Wan, Houston, TX (US)

(72) Inventors: Marcel A. Grubert, Montgomery, TX (US); David E. Courtnage, St. Marys (CA); Jing Wan, Houston, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 433 days.

(21) Appl. No.: 14/437,166

(22) PCT Filed: Nov. 18, 2013

(86) PCT No.: PCT/US2013/070608
§ 371 (c)(1),
(2) Date: Apr. 20, 2015

(87) PCT Pub. No.: WO2014/105288
PCT Pub. Date: Jul. 3, 2014

(65) Prior Publication Data
US 2015/0292294 A1 Oct. 15, 2015

Related U.S. Application Data

(60) Provisional application No. 61/746,481, filed on Dec. 27, 2012.

(51) Int. Cl.
*E21B 43/10* (2006.01)
*E21B 43/12* (2006.01)
(Continued)

(52) U.S. Cl.
CPC ............ *E21B 33/124* (2013.01); *E21B 43/04* (2013.01); *E21B 43/08* (2013.01); *E21B 43/12* (2013.01);
(Continued)

(58) Field of Classification Search
CPC .......... E21B 43/14; E21B 43/08; E21B 43/12; E21B 43/082; E21B 43/088
See application file for complete search history.

(56) References Cited

U.S. PATENT DOCUMENTS

| | | | | |
|---|---|---|---|---|
| 2,963,088 A | * | 12/1960 | Corley, Jr. | ............... E21B 43/14 166/297 |
| 3,003,563 A | * | 10/1961 | Kenneday | ............... E21B 43/14 166/114 |

(Continued)

FOREIGN PATENT DOCUMENTS

| | | |
|---|---|---|
| WO | WO 2010/005990 | 1/2010 |
| WO | WO 2010/051301 | 5/2010 |
| WO | WO 2012/082447 | 6/2012 |

*Primary Examiner* — Kipp C Wallace
(74) *Attorney, Agent, or Firm* — ExxonMobil Upstream Research Company—Law Department

(57) ABSTRACT

A zonal isolation apparatus for an open-hole wellbore completed with a gravel pack having sections of blank pipe intermediate selected sections of sand screen, comprising a blank liner, with a first packer and second packer disposed therein. The first and second packers are set adjacent to sections of blank pipe and seal an annular area formed between the blank liner and the surrounding sections of sand screen at the first and second sections of blank pipe. The flow of fluids into the wellbore intermediate the first and second sections of blank pipe is inhibited.

22 Claims, 15 Drawing Sheets

(51) Int. Cl.
  *E21B 43/08* (2006.01)
  *E21B 33/124* (2006.01)
  *E21B 43/04* (2006.01)
  *E21B 43/14* (2006.01)
  *E21B 47/00* (2012.01)
  *G06F 17/50* (2006.01)

(52) U.S. Cl.
  CPC .............. *E21B 43/14* (2013.01); *E21B 47/00* (2013.01); *G06F 17/5009* (2013.01)

(56) References Cited

U.S. PATENT DOCUMENTS

| | | | | |
|---|---|---|---|---|
| 3,385,367 | A * | 5/1968 | Kollsman | E21B 33/1208 166/191 |
| 4,893,676 | A * | 1/1990 | Hill | E21B 43/263 166/153 |
| 5,090,478 | A * | 2/1992 | Summers | C09K 8/56 166/278 |
| 2002/0096329 | A1 * | 7/2002 | Coon | E21B 34/12 166/278 |
| 2002/0125641 | A1 | 9/2002 | Moody | |
| 2002/0189808 | A1 | 12/2002 | Nguyen et al. | |
| 2003/0034160 | A1 | 2/2003 | Nguyen et al. | |
| 2005/0016740 | A1 * | 1/2005 | Aldaz | E21B 33/1246 166/387 |
| 2005/0230105 | A1 * | 10/2005 | Valenti | E21B 43/12 166/242.3 |
| 2008/0066912 | A1 * | 3/2008 | Freyer | E21B 33/1208 166/297 |
| 2010/0000740 | A1 | 1/2010 | Dale et al. | |
| 2010/0139919 | A1 | 1/2010 | Yeh et al. | |
| 2010/0032158 | A1 | 2/2010 | Dale et al. | |
| 2010/0212895 | A1 * | 8/2010 | Vickery | E21B 43/12 166/278 |
| 2011/0067890 | A1 * | 3/2011 | Themig | E21B 43/12 166/387 |
| 2014/0083682 | A1 * | 3/2014 | Grigsby | E21B 43/04 166/250.01 |
| 2014/0262260 | A1 * | 9/2014 | Mayer | E21B 43/08 166/278 |

\* cited by examiner

APPARATUS AND METHOD FOR ISOLATING FLUID FLOW IN AN OPEN HOLE COMPLETION

CROSS REFERENCE TO RELATED APPLICATIONS

This application is the National Stage of International Application No. PCT/US2013/070608, filed Nov. 18, 2013, which claims the benefit of U.S. Provisional Patent No. 61/746,481, filed Dec. 27, 2012. The application is incorporated by reference herein in its entirety.

BACKGROUND OF THE INVENTION

This section is intended to introduce various aspects of the art, which may be associated with exemplary embodiments of the present disclosure. This discussion is believed to assist in providing a framework to facilitate a better understanding of particular aspects of the present disclosure. Accordingly, it should be understood that this section should be read in this light, and not necessarily as admissions of prior art.

Field Of The Invention

The present disclosure relates to the field of well completions. More specifically, the present invention relates to the isolation of formations in connection with wellbores that have been completed using gravel-packing. The application also relates to methods for isolating subsurface intervals along an open-hole wellbore.

Discussion Of Technology

In the drilling of oil and gas wells, a wellbore is formed using a drill bit that is urged downwardly at a lower end of a drill string. After drilling to a predetermined depth, the drill string and bit are removed and the wellbore is lined with a string of casing. An annular area is thus formed between the string of casing and the formation. A cementing operation is typically conducted in order to fill or "squeeze" the annular area with cement. The combination of cement and casing strengthens the wellbore and facilitates the isolation of formations and aquifers behind the casing.

It is common to place several strings of casing having progressively smaller outer diameters into the wellbore. The process of drilling and then cementing progressively smaller strings of casing is repeated several times until the well has reached total depth. The final string of casing, referred to as a production casing, is cemented in place and perforated. In some instances, the final string of casing is a liner, that is, a string of casing that is not tied back to the surface.

As part of the completion process, a wellhead is installed at the surface. The wellhead controls the flow of production fluids to the surface, or the injection of fluids into the wellbore. Fluid gathering and processing equipment such as pipes, valves and separators are also provided. Production operations may then commence.

It is sometimes desirable to leave the bottom portion of a wellbore open. In this instance, production casing is not set in the wellbore, but the well is instead completed as an "open-hole wellbore." In open-hole completions, a production casing is not extended through the producing zones and perforated; rather, the producing zones are left uncased, or "open." A production string or "tubing" is then positioned inside the wellbore extending down below the last string of casing and across a subsurface formation.

There are certain advantages to open-hole completions versus cased-hole completions. First, because open-hole completions have no perforation tunnels, formation fluids can converge on the wellbore longitudinally and radially 360 degrees. This has the benefit of eliminating the additional pressure drop associated with converging radial flow and then linear flow through particle-filled perforation tunnels. The reduced pressure drop associated with an open-hole completion virtually guarantees that it will be more productive than an unstimulated, cased hole in the same formation.

Second, open-hole techniques are oftentimes less expensive than cased hole completions. For example, open-hole completions generally do not require cementing, perforating, and post-perforation clean-up operations. However, open-hole completions carry their own set of problems.

A common problem in open-hole completions is the immediate exposure of the wellbore to the surrounding formation. If the formation is unconsolidated or heavily sandy, the flow of production fluids into the wellbore may carry with it formation particles, e.g., sand and fines. Such particles can be erosive to production equipment downhole and to pipes, valves and separation equipment at the surface.

To control the invasion of sand and other particles, sand control devices may be employed. Sand control devices are usually installed downhole across formations to retain solid materials larger than a certain diameter while allowing fluids to be produced. A sand control device typically includes an elongated tubular body, known as a base pipe, having numerous pre-drilled holes, or slotted openings. The base pipe is then typically wrapped with a filtration medium such as a screen or wire mesh.

To augment sand control devices, particularly in open-hole completions, it is common to install a gravel pack. Gravel packing a well involves placing gravel or other particulate matter around the sand control device after the sand control device is hung or otherwise placed in the wellbore. To install a gravel pack, a particulate material is delivered downhole by means of a carrier fluid. The carrier fluid with the gravel together form a gravel slurry. As the carrier fluid is pumped downhole, it moves into the formation, leaving a circumferential packing of gravel around the screen. The gravel not only aids in particle filtration but also helps maintain formation integrity by supporting the surrounding formation.

In an open-hole gravel pack completion, the gravel is positioned between a sand screen that surrounds a perforated base pipe and a surrounding wall of the wellbore. During production, formation fluids flow from the subterranean formation, through the gravel, through the screen, and into the pre-slotted base pipe. The base pipe thus serves as a part of the production string.

It is known to install multiple sand screens across multiple producing intervals. This arrangement works fine as long as each interval is producing hydrocarbon fluids, particularly oil. However, in some instances an interval may begin to produce unwanted volumes of water. This may be due to a fingering of water from an injection well. Alternatively, such may be due to a rise in the water level subsurface, such as in connection with a water-drive reservoir or due to the presence of native water zones, coning (rise of near-well hydrocarbon-water contact), high permeability streaks, or natural fractures. Depending on the mechanism or cause of the water production, the water may be produced at different locations and times during a well's lifetime. In any of these instances, it is desirable to be able to isolate that interval to shut off or at least inhibit the flow of water into the wellbore.

An interval may alternatively begin to produce an unwanted volume of gas. This may be due to a breakthrough of gas at an interval in connection with an enhanced oil recovery operation. Alternatively, a gas cap above an oil reservoir may expand and break through, causing gas production with oil. The gas breakthrough reduces gas cap drive and suppresses oil production. Once again, it is desirable to be able to isolate that interval so as to shut off or at least inhibit the flow of gas into the wellbore.

In the case of open hole gravel pack completions, the isolation of zones or intervals is problematic. Specialized bypass packers are being developed that allow for a certain amount of annular isolation. During the completion phase, packer locations are chosen so that potential troublesome regions of the well such as higher permeability zones can be isolated. This also assists later during workover operations. While the use of specialized packers is increasing, numerous older wells exist that do not have zonal isolation capabilities. As these wells mature, they can experience an unwanted inflow of water or gas as described above.

Various workover approaches have been employed for zonal isolation in older completions. For example, cement squeezing may take place along an intermediate zone. The cement is delivered using coiled tubing or a wireline tool. The hope is to plug a section of sand screen. Alternatively, cement may be dumped into the bottom of the well to close off a lower zone. However, the use of cement may be expensive and has the potential of plugging productive subsurface intervals along with encroachment intervals.

A foam compound may also be injected into an intermediate zone using coiled tubing. The foam compound serves to plug a selected interval. However, foam compounds generally do not hold for long since the water degrades the foam with time, or the water finds new paths around the plugged area.

Therefore, a need exists for an apparatus that isolates fluid flow along a selected zone in an open-hole, gravel pack completion. In addition, a need exists for a method of isolating fluid inflow along a selected subsurface interval in an open-hole wellbore in a cost-effective manner.

SUMMARY OF THE INVENTION

A zonal isolation apparatus for an open-hole wellbore is first provided herein. The wellbore has been completed with a gravel pack having multiple sections of sand screen, and with sections of blank pipe intermediate the respective sections of sand screen. The multiple sections of sand screen may represent at least a first length of sand screen, a third length of sand screen, and a second length of sand screen intermediate the first and third lengths of sand screen.

In one aspect, the apparatus first includes a blank liner. The blank liner has an outer diameter that is dimensioned to be received within the sections of sand screen.

The apparatus also includes a first packer and a second packer. The packers reside along the blank liner. The first packer is set adjacent a first section of the blank pipe. This creates a substantial seal within an annular area formed between the blank liner and the surrounding first section of blank pipe. Similarly, the second packer is set adjacent a second section of the blank pipe. The creates a substantial seal within an annular area formed between the blank liner and the surrounding second length of blank pipe.

It is noted that the lengths of blank pipe may be sections of tubing that are threadedly connected at the opposing ends of the sand control devices. Alternatively, the lengths of blank pipe may be blank end sections of the sand control devices themselves. In either instance, the placement of the blank liner along the sand control devices, coupled with the first set packer and the second set packer, inhibits the flow of fluids into the bore of the base pipe intermediate the first and second sections of blank pipe.

Preferably, each of the first packer and the second packer is a swellable packer. In one aspect, the first packer and the second packer straddle the second length of sand screen.

In one embodiment, the zonal isolation apparatus further comprises a third packer. The third packer resides along the blank liner and is set intermediate the first and second packers. In one aspect, the zonal isolation apparatus still further comprises a fourth packer. The fourth packer also resides along the blank liner, and is set intermediate the first and second packers. In one aspect, the third and fourth packers are set along the second length of sand screen intermediate the first and second sections of blank pipe. The third and fourth packers may be set along the base pipe. More preferably, the third and fourth packers are set along lengths of blank pipe residing between sand screen joints within the second length of sand screen.

An alternate zonal isolation apparatus for an open-hole wellbore is provided herein. Once again, the wellbore is completed with a gravel pack having multiple sections of sand screen and with sections of blank pipe intermediate the respective sections of sand screen. The multiple sections of sand screen may comprise at least an upper length of sand screen, a lowest length of sand screen, and an intermediate length of sand screen between the upper and lowest length of sand screen.

Here, the apparatus comprises a flow reduction device set adjacent a section of blank pipe. The inflow reduction device is set above the lowest section of sand screen. In this instance, the flow reduction device comprises a column of sand.

The inflow reduction device may further comprise a plug. The plug is set adjacent the section of blank pipe above the lowest length of sand screen. In this instance, the column of sand is placed at least partially above the plug.

In another aspect, the column of sand is set across the entire length of the lowest length of sand screen up to at least the section of blank pipe above the lowest length of sand screen. A plug may or may not be used above the lowest length of sand screen. In either instance, fluids from the subsurface interval adjacent the lowest length of sand screen are inhibited from flowing up the wellbore along the lowest length of sand screen.

A method for isolating a subsurface zone along an open-hole wellbore is also provided herein. Once again, the wellbore is completed with a gravel pack having multiple sections of sand screen, and with sections of blank pipe intermediate the respective sections of sand screen. The multiple sections of sand screen may represent at least a first length of sand screen, a third length of sand screen, and a second length of sand screen intermediate the first and third lengths of sand screen. The lengths of sand screen may employ two or more joints of sand screen each.

In one aspect, the method comprises running a blank liner into the wellbore. The blank liner has an outer diameter that is dimensioned to be received within the sections of sand screen. The blank liner has a first packer and a second packer disposed there along.

The method also includes setting the first packer adjacent a first section of the blank pipe. In this way an annular area formed between the blank liner and the surrounding first length of blank pipe is substantially sealed. The method further includes setting a second packer adjacent the second length of blank pipe so as to substantially seal the annular area formed between the blank liner and the surrounding second length of blank pipe. Fluids from the subsurface interval are thereby inhibited from flowing up the wellbore intermediate the first and second sections of blank pipe.

It is preferred that each of the first packer and the second packer is a swellable packer. In this instance, the steps of setting the first packer and setting the second packer comprise exposing the first packer and the second packer to wellbore fluids in situ for a period of time. This, in turn, allows the first packer and the second packer to expand.

In one aspect, the first length of sand screen, the second length of sand screen, and the third length of sand screen is each about 10 feet to 200 feet in length. Further, the first section of blank pipe and the second section of blank pipe is each about three feet to 50 feet in length. Preferably, the first packer and the second packer straddle the second length of sand screen between sections of blank pipe.

In another aspect, the blank liner also has a third packer disposed there along and, optionally, a fourth packer disposed there along. The third packer and the optional fourth packer reside intermediate the first and second packers. In this instance, the method further comprises setting the third packer and the optional fourth packer. The third and fourth packers may be set along the base pipe. More preferably, the third and fourth packers are set along lengths of blank pipe residing between sand screen joints within the second length of sand screen. In either instance, each of the third packer and the fourth packer may also be a swellable packer.

In still another aspect, the blank liner also has a fifth packer disposed there along. The fifth packer may reside along the first length of sand screen above the first section of blank pipe. Alternatively, the fifth packer may reside along the third length of sand screen below the second section of blank pipe. In either instance, the method further comprises setting the additional packer. Preferably, the fifth packer is set along a section of blank pipe.

In any of the above embodiments, the method may also include producing hydrocarbon fluids from the open-hole portion of the wellbore.

BRIEF DESCRIPTION OF THE DRAWINGS

So that the manner in which the present inventions can be better understood, certain illustrations, charts and/or flow charts are appended hereto. It is to be noted, however, that the drawings illustrate only selected embodiments of the inventions and are therefore not to be considered limiting of scope, for the inventions may admit to other equally effective embodiments and applications.

DETAILED DESCRIPTION OF CERTAIN EMBODIMENTS

Definitions

Figure 1:
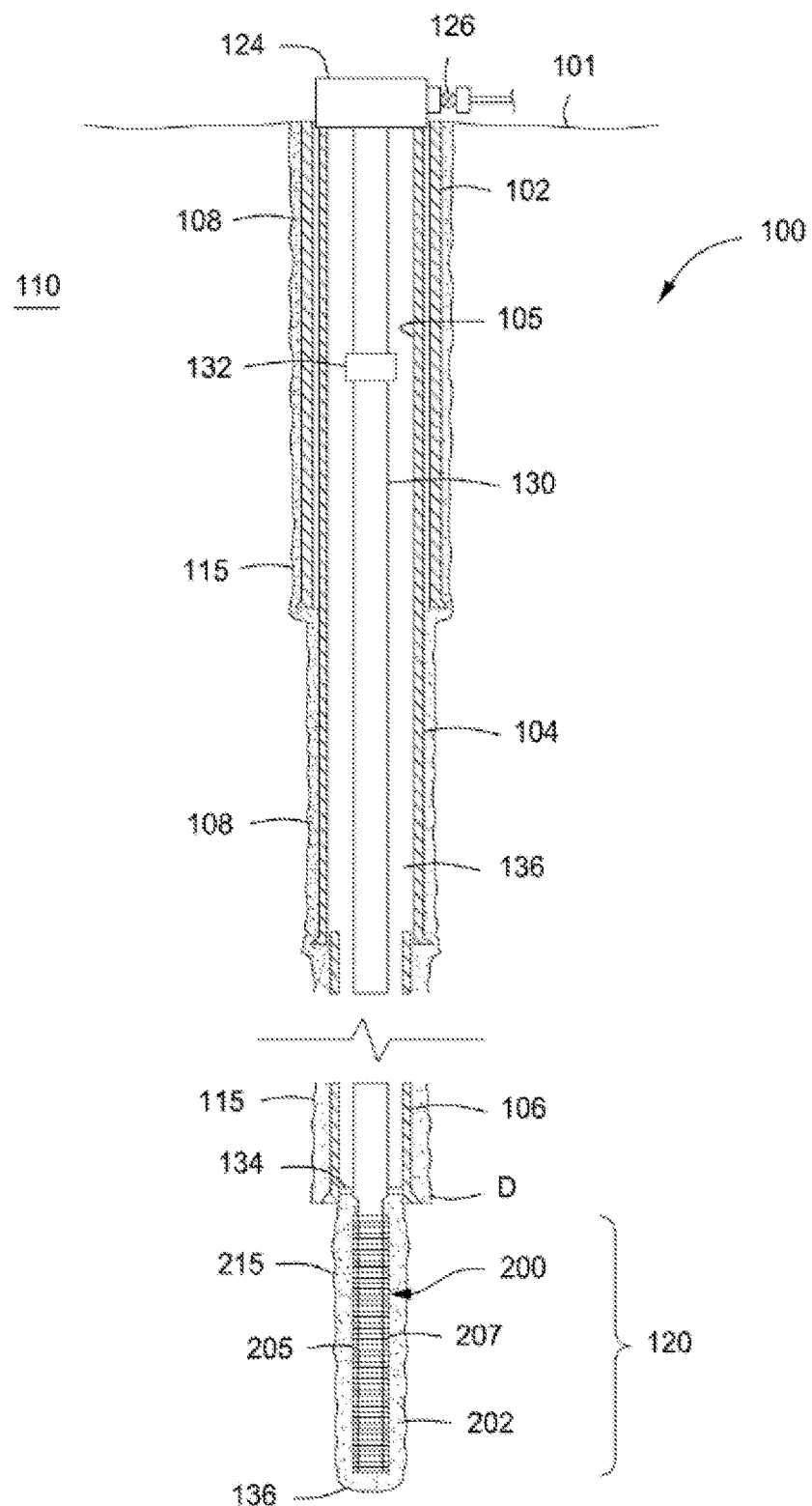
FIG. 1 is a cross-sectional view of an illustrative wellbore. The wellbore has been drilled into a subsurface formation having different subsurface intervals. The intervals are under formation pressure and contain fluids.

As used herein, the term "hydrocarbon" refers to an organic compound that includes primarily, if not exclusively, the elements hydrogen and carbon. Hydrocarbons generally fall into two classes: aliphatic, or straight chain hydrocarbons, and cyclic, or closed ring hydrocarbons, including cyclic terpenes. Examples of hydrocarbon-containing materials include any form of natural gas, oil, coal, and bitumen that can be used as a fuel or upgraded into a fuel.

As used herein, the term "hydrocarbon fluids" refers to a hydrocarbon or mixtures of hydrocarbons that are gases or liquids. For example, hydrocarbon fluids may include a hydrocarbon or mixtures of hydrocarbons that are gases or liquids at formation conditions, at processing conditions or at ambient conditions (15° C. and 1 atm pressure). Hydrocarbon fluids may include, for example, oil, natural gas, coal bed methane, shale oil, pyrolysis oil, pyrolysis gas, a pyrolysis product of coal, and other hydrocarbons that are in a gaseous or liquid state.

As used herein, the terms "produced fluids" and "production fluids" refer to liquids and/or gases removed from a subsurface formation, including, for example, an organic-rich rock formation. Produced fluids may include both hydrocarbon fluids and non-hydrocarbon fluids. Production fluids may include, but are not limited to, pyrolyzed shale oil, synthesis gas, a pyrolysis product of coal, carbon dioxide, hydrogen sulfide and water (including steam). Produced fluids may include both hydrocarbon fluids and non-hydrocarbon fluids.

As used herein, the term "condensable hydrocarbons" means those hydrocarbons that condense to a liquid at about 25° C. and one atmosphere absolute pressure. Condensable hydrocarbons may include a mixture of hydrocarbons having carbon numbers greater than 4.

As used herein, the term "non-condensable" means those chemical species that do not condense to a liquid at about 25° C. and one atmosphere absolute pressure. Non-condensable species may include non-condensable hydrocarbons and non-condensable non-hydrocarbon species such as, for example, carbon dioxide, hydrogen, carbon monoxide, hydrogen sulfide, and nitrogen. Non-condensable hydrocarbons may include hydrocarbons having carbon numbers less than 5.

As used herein, the term "fluid" refers to gases, liquids, and combinations of gases and liquids, as well as to combinations of gases and solids, and combinations of liquids and solids.

As used herein, the term "oil" refers to a hydrocarbon fluid containing a mixture of condensable hydrocarbons.

As used herein, the term "subsurface" refers to geologic strata occurring below the earth's surface.

The term "subsurface interval" refers to a formation or a portion of a formation wherein formation fluids may reside. The fluids may be, for example, hydrocarbon liquids, hydrocarbon gases, aqueous fluids, or combinations thereof.

As used herein, the term "wellbore" refers to a hole in the subsurface made by drilling or insertion of a conduit into the subsurface. A wellbore may have a substantially circular cross section, or other cross-sectional shape. As used herein, the term "well", when referring to an opening in the formation, may be used interchangeably with the term "wellbore."

The term "tubular member" refers to any pipe, such as a joint of casing, a portion of a liner, or a pup joint.

The term "blank pipe" or "blank liner" refers to a tubular member that does not have slots or perforations. The "blank pipe" may either be a stand-alone joint, such as a joint of tubing, or may be a blank portion of pipe extending up from a base pipe in a sand control device.

The term "sand control device" means any elongated tubular body that permits an inflow of fluid into an inner bore or a base pipe while filtering out predetermined sizes of sand, fines and granular debris from a surrounding formation.

DESCRIPTION OF SPECIFIC EMBODIMENTS

The inventions are described herein in connection with certain specific embodiments. However, to the extent that the following detailed description is specific to a particular embodiment or a particular use, such is intended to be illustrative only and is not to be construed as limiting the scope of the inventions.

Certain aspects of the inventions are also described in connection with various figures. In certain of the figures, the top of the drawing page is intended to be toward the surface, and the bottom of the drawing page toward the well bottom. While wells commonly are completed in substantially vertical orientation, it is understood that wells may also be inclined and or even horizontally completed. When the descriptive terms "up and down" or "upper" and "lower" or similar terms are used in reference to a drawing or in the claims, they are intended to indicate relative location on the drawing page or with respect to claim terms, and not necessarily orientation in the ground, as the present inventions at least in some embodiments have utility no matter how the wellbore is orientated.

FIG. 1 is a cross-sectional view of an illustrative wellbore 100. The wellbore 100 defines a bore 105 that extends from an earth surface 101, and into the earth's subsurface 110. The bore 105 is within a wellbore wall, shown at 115.

The wellbore 100 is completed to have an open-hole portion 120. The open-hole portion 120 is at a lower end of the wellbore 100. The open-hole portion 120 is within a wellbore wall 215.

The wellbore 100 has been formed for the purpose of producing hydrocarbons for commercial sale. To this end, a string of production tubing 130 is provided in the bore 105. The production tubing 130 transports production fluids from the open-hole portion 120 up to the surface 101.

The wellbore 100 includes a well tree, shown schematically at 124. The well tree 124 includes a shut-in valve 126. The shut-in valve 126 controls the flow of production fluids from the wellbore 100. In addition, a subsurface safety valve 132 is optionally provided to block the flow of fluids from the production tubing 130 in the event of a catastrophic event at the well tree 124 or anywhere above the subsurface safety valve 132. The wellbore 100 may optionally have a pump (not shown) within or just above the open-hole portion 120 to artificially lift production fluids from the open-hole portion 120 up to the well tree 124. Alternatively, a hydraulic rod pump (not shown) may optionally be provided proximate the surface 101 for lifting production fluids.

The wellbore wall 115 is supported by setting a series of pipes into the subsurface 110. These pipes include a first string of casing 102, sometimes known as surface casing or a conductor. The pipes also include at least a second 104 and a third 106 string of casing. The casing strings 104, 106 are intermediate casing strings that provide support for walls of the wellbore 100. Intermediate casing strings 104, 106 may be hung from the surface 101, or they may be hung from a next higher casing string using an expandable liner or liner hanger. It is understood that a pipe string that does not extend back to the surface (such as casing string 106) is normally referred to as a "liner."

In the illustrative wellbore arrangement of FIG. 1, intermediate casing string 104 is hung from the surface 101, while casing string 106 is hung from a lower end of casing string 104. Additional intermediate casing strings (not shown) may be employed. The present inventions are not limited to the type of casing arrangement used above the open-hole portion 120.

Each string of casing 102, 104, 106 is set in place through cement 108. The cement 108 isolates the various formations of the subsurface 110 from the wellbore 100 and each other. The cement 108 extends from the surface 101 to a depth "D" at a lower end of the casing string 106. It is understood that some intermediate casing strings may not be fully cemented.

In many wellbores, a final casing string known as production casing is cemented into place at a depth where subsurface production intervals reside. However, the illustrative wellbore 100 is completed as an open-hole wellbore. Accordingly, the wellbore 100 does not include a final casing string along the open-hole portion 120.

Figure 2:
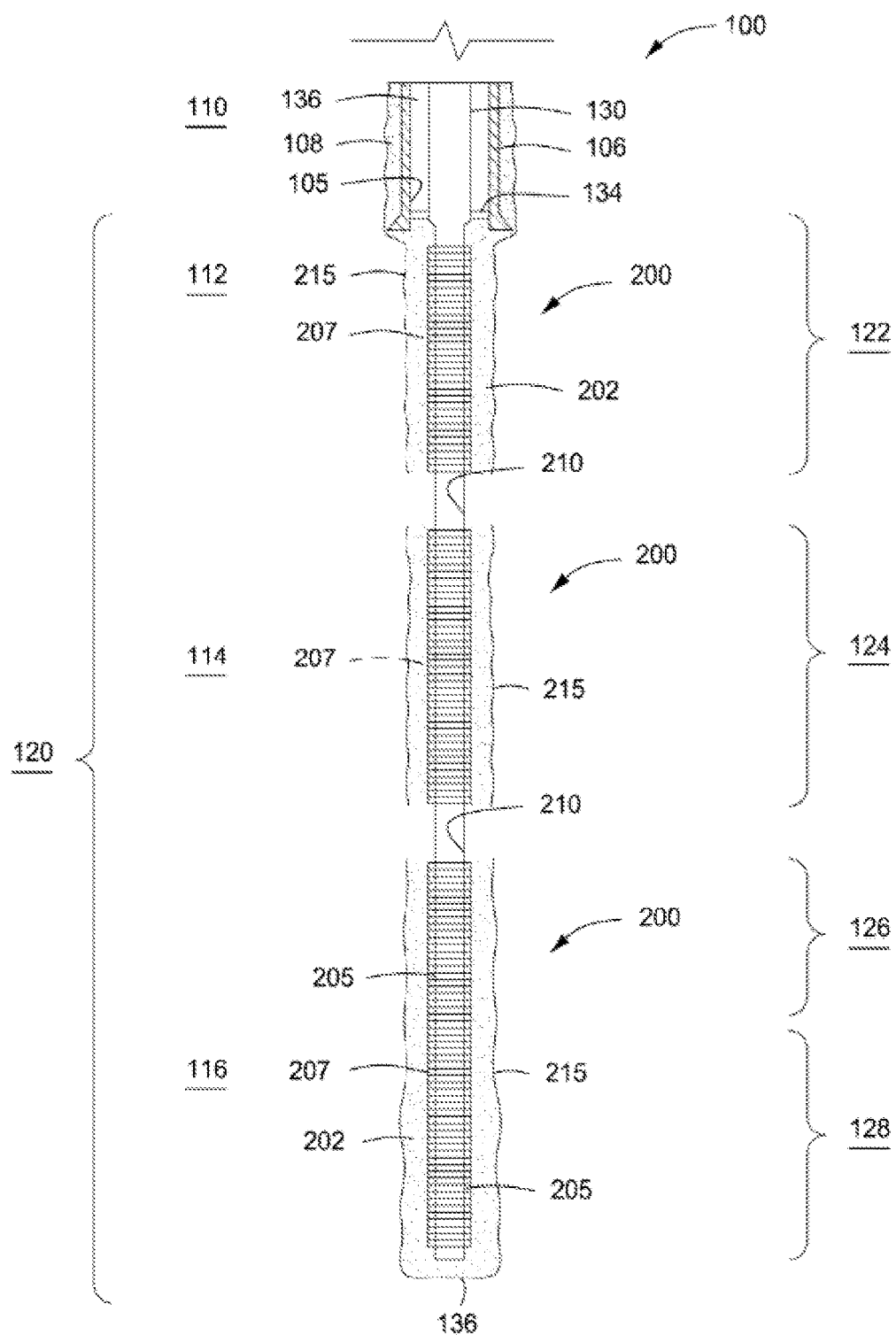
FIG. 2 is an enlarged cross-sectional view of the wellbore of FIG. 1. The wellbore has been completed with an open-hole portion at the depth of the subsurface intervals. The open-hole completion includes a gravel pack.

In the illustrative wellbore 100, the open-hole portion 120 traverses several different subsurface intervals along the wellbore wall 215. These intervals are shown and identified in FIG. 2. FIG. 2 is an enlarged cross-sectional view of the wellbore 100 of FIG. 1. In FIG. 2, the open-hole portion 120 is more clearly seen along with several intervals identified at 122, 124, 126, 128. Each interval 122, 124, 126, 128 is under formation pressure and at least initially contains hydrocarbon fluids, including oil.

The wellbore 100 is completed with a sand screen 200. The sand screen 200 traverses across the open-hole portion 120 of the wellbore 100 and receives fluids from the surrounding formation. The sand screen 200 includes a perforated base pipe 205. The base pipe 205 typically is made up of a plurality of pipe joints. The base pipe 205 (or each pipe joint making up the base pipe 205) typically has small perforations or slots to permit the inflow of production fluids. Fluids are delivered from the base pipe 205 under pressure up to the production tubing 130.

To ensure that fluids flow from the base pipe 205 and to the surface, a production packer 134 is set along the production tubing 130. The production packer 134 seals an annular region 136 between the production tubing 130 and the surrounding casing strings 102, 104, 106. The packer 134 ensures that production fluids flow to the surface 101 through the production tubing 130.

The sand screen 200 is part of a gravel pack. Gravel is shown at 202 surrounding the sand screen 200. The gravel 202 largely extends from the production packer 134 to a lower end 136 of the wellbore 100. The gravel 202 is placed into the open-hole portion 120 as a slurry. Water within the slurry is removed, leaving "sand" packed around the sand screen 200.

The sand control devices 200 also contain a filter medium 207. The filter medium 207 is wound or otherwise placed radially around the base pipes 205. The filter medium 207 may be a wire mesh screen or a wire wrap fitted around the base pipe 205. The filter medium 207 prevents the inflow of sand or other particles above a pre-determined size into the base pipe 205 and the production tubing 130. The base pipe 205 and connected filter medium 207 are typically referred to together as "sand screen" or joints of sand screen.

In addition to the sand control devices 200, the wellbore 100 includes one or more sections of blank pipe 210. The blank pipe 210 represents section of pipe that contain no slots or perforations. The blank pipe 210 may be provided as separate joints connected between joints of sand screen. Alternatively, the blank pipe 210 may be short non-slotted extensions of the base pipe used for threadedly connecting joints of sand screen (or sand control devices 200) together. Additional joints of blank pipe 210 may be used to separate sand control devices 200 at different subsurface intervals.

Joints of sand screen may be anywhere from 20 feet to 40 feet in length. The sand screen joints are threadedly connected end-to-end to create a sand control device 200 at a designated depth or interval. In some instances, a sand control device or sand screen 200 may be many hundreds of feet in length.

The joints of blank pipe may be anywhere from a few feet to even 40 feet in length. Blank pipe 210 may be threadedly connected end-to-end to separate sections of sand screen 200. In some instances, the blank pipe 210 may be 5 feet to even hundreds of feet in length. Generally, the blank pipe 210 will be placed between subsurface intervals. In the arrangement of FIG. 2, blank pipe 210 is provided between intervals 122 and 124, and between intervals 124 and 126. Of course, it is understood that the completion arrangement in FIG. 2 is merely illustrative and that other arrangements for blank pipe 210 along sand screen joints may be employed.

Figure 3A:
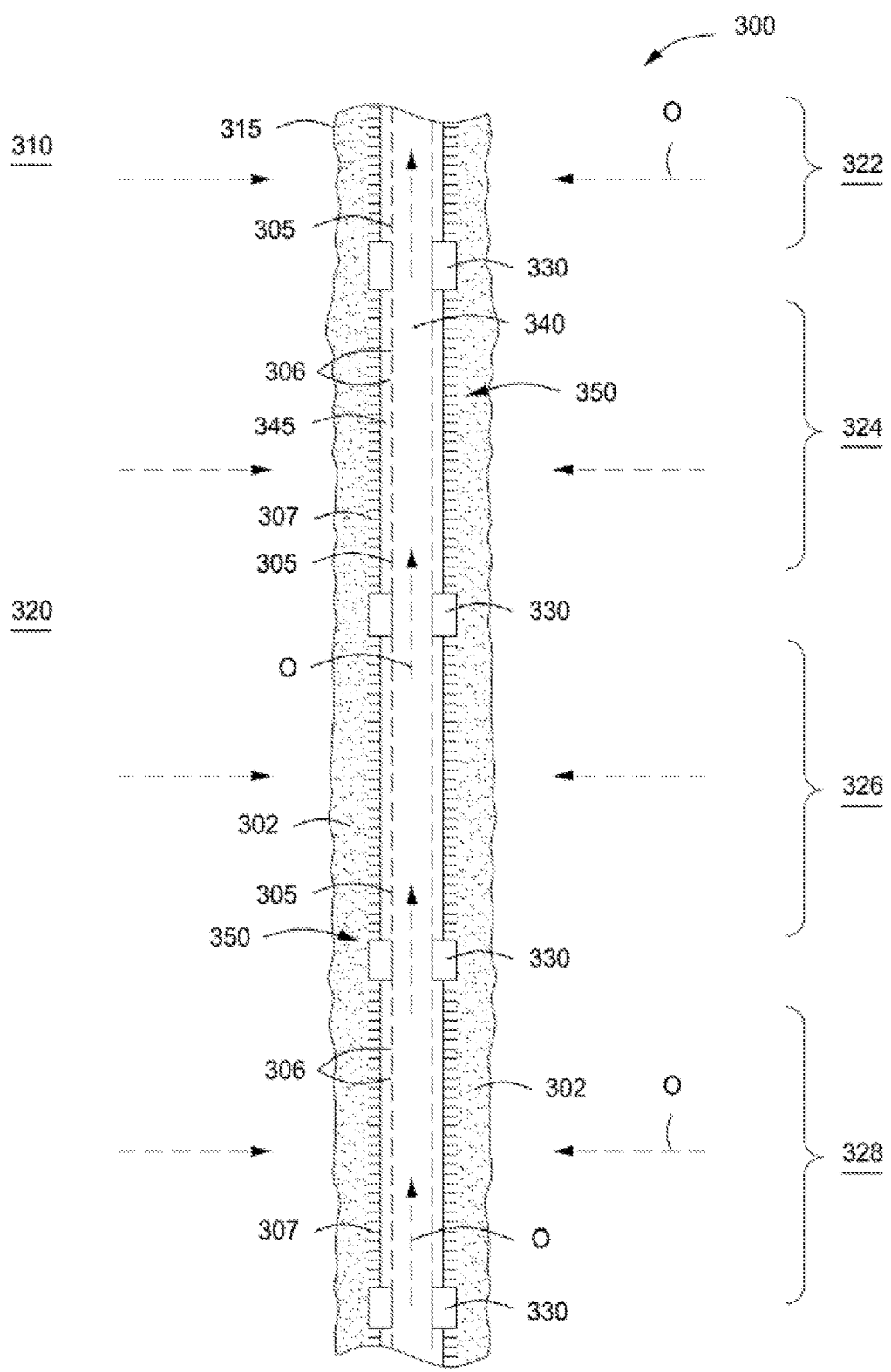
FIG. 3A is a side view of a wellbore. The wellbore represents a portion of an open-hole completion near the bottom of a wellbore. Here, a sand screen with gravel packing is shown in cross-section running through several subsurface intervals. Hydrocarbon fluids are seen entering the wellbore for production.

FIG. 3A presents a side view of a wellbore 300. The wellbore 300 represents a portion of an open-hole 320 near the bottom of the wellbore 300. The wellbore 300 penetrates through a subsurface formation 310 down to the open-hole portion 320.

As with wellbore 100 of FIG. 2, the wellbore 300 is completed with sand control devices 350. The sand control devices 350 comprise sand screens made up of joints of perforated base pipe 305. Pre-drilled holes are seen along the base pipe 305 at 306. The holes (or slots) 306 permit an inflow of reservoir fluids. At the same time, sections of screen or other filter medium 307 are placed around the base pipe 305 to filter out sand and other particles from the formation 310. In addition, gravel 302 is packed into an annular region formed between the filter medium 307 and a surrounding borehole wall 315.

Sections of the sand control devices 350 are separated by joints of blank pipe 330. The blank pipe 330 is generally located between respective intervals 322, 324, 326, 328 along the open-hole portion 320. The blank pipe 330 represents sections of tubular bodies that are not slotted or perforated.

Hydrocarbon fluids are seen entering the wellbore 300 for production. The flow of hydrocarbon fluids is shown through dashed lines "O." The hydrocarbon fluids come into the wellbore 300 from each interval 322, 324, 326, 328. Intervals 322, 324, 326, 328 generally represent geologic strata comprised of sand or other permeable and at least partially unconsolidated rock matrix.

As fluids flow from the various intervals 322, 324, 326, 328 and into the wellbore 300, the fluids will migrate through the filter medium 307, through the slots, and into a bore 340 within the base pipe 305. Formation fluids will then flow up the bore 340 and to the surface 101. It is also noted that fluids may also migrate up the wellbore 300 by means of a very small annular region 345 formed between the base pipe 305 and the surrounding filter medium 307. However, the annulus 345 stops at the sections of blank pipe 330.

Figure 3B:
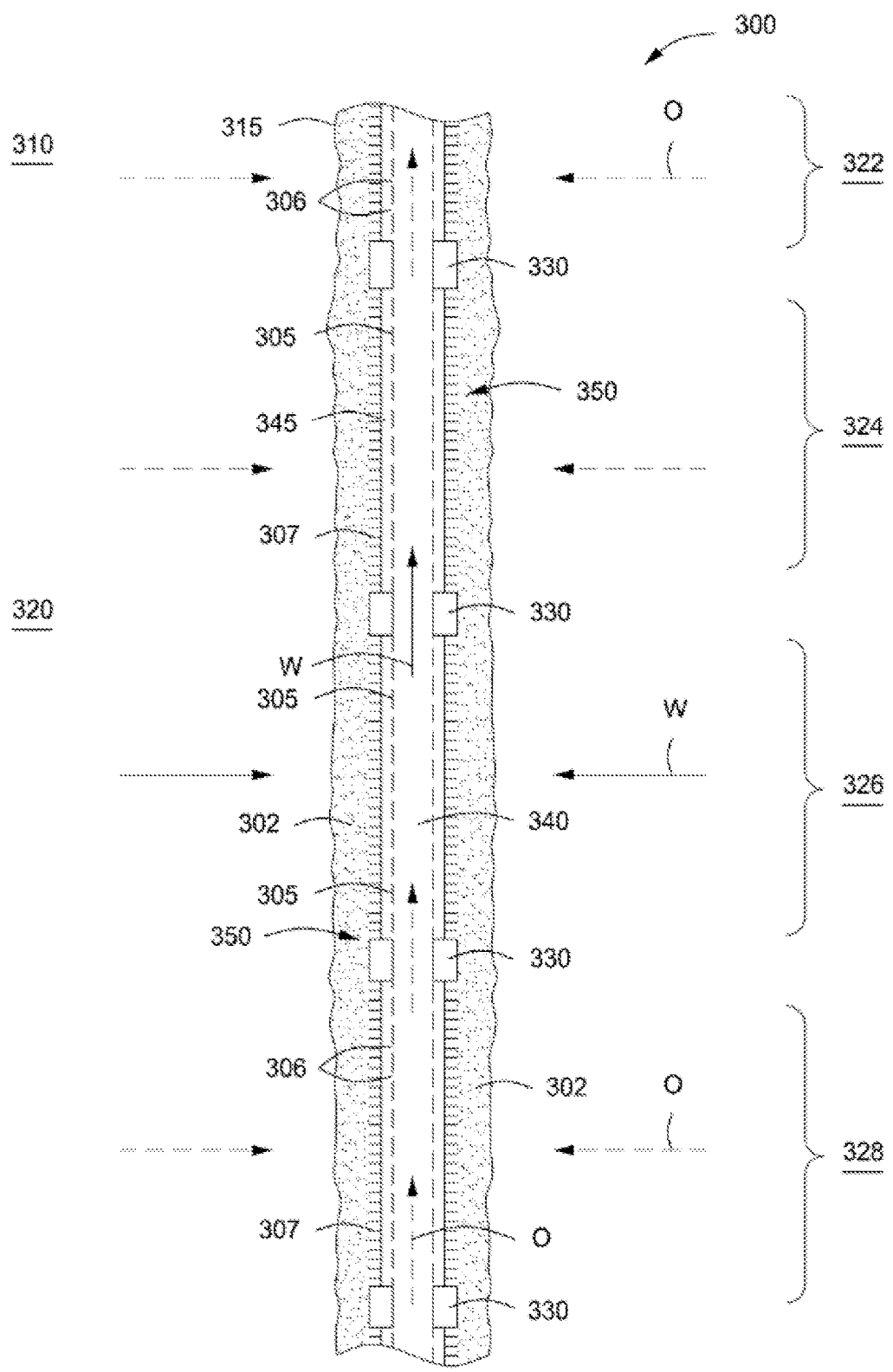
FIG. 3B is another side view of the open-hole wellbore of FIG. 3A. Here, a reservoir fluid that is not primarily oil has broken through to the wellbore along an intermediate subsurface interval.

FIG. 3B is another side view of the open-hole completion 320 of FIG. 3A. Hydrocarbon fluids are again seen entering the wellbore 300 for production. The flow of hydrocarbon fluids is shown through dashed lines "O." However, a reservoir fluid that is not primarily oil has broken through to the wellbore 300 along intermediate subsurface interval 326. The flow of a non-hydrocarbon fluid is indicated at line "W." The reservoir fluid may be, for example, formation water, formation gas, or injected water.

The reason for the change in fluid content may be due to any of several reservoir conditions. For example, water may encroach through interval 326 due to the presence of native water zones, high permeability streaks or natural fractures in the aquifer, or fingering from injection wells. Alternatively, encroachment may be due to a rise of a hydrocarbon-water contact. In any instance, it is desirable to at least partially restrict the flow of the non-oil fluid "W" into the wellbore 300 through a remediation procedure that is quick and economical.

In order to inhibit inflow of non-oil fluids "W," a straddle liner is provided herein. A first embodiment of a straddle liner 400' is provided in FIG. 3C.

Figure 3C:
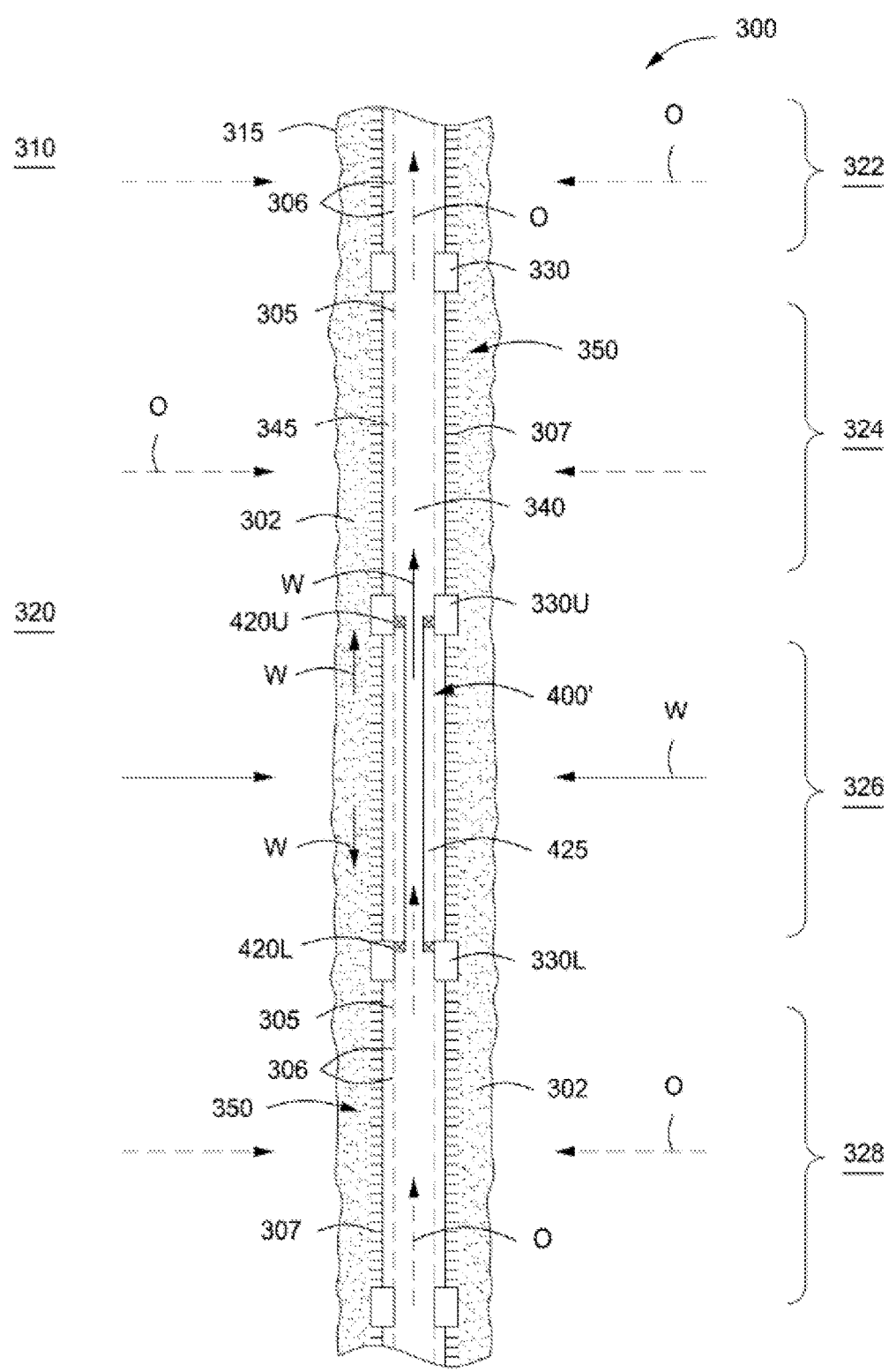
FIG. 3C is another side view of the open-hole wellbore of FIG. 3A. Here, a so-called straddle liner has been set in the wellbore across the intermediate interval. Packers have also been set across blank pipe portions of the sand screen to inhibit the flow of the non-oil fluids into the wellbore.

FIG. 3C offers another side view of the open-hole wellbore 300 of FIG. 3A. Here, the straddle liner 400' has been set in the wellbore 300. The straddle liner 400' has been set across the intermediate interval 326.

Figure 4:
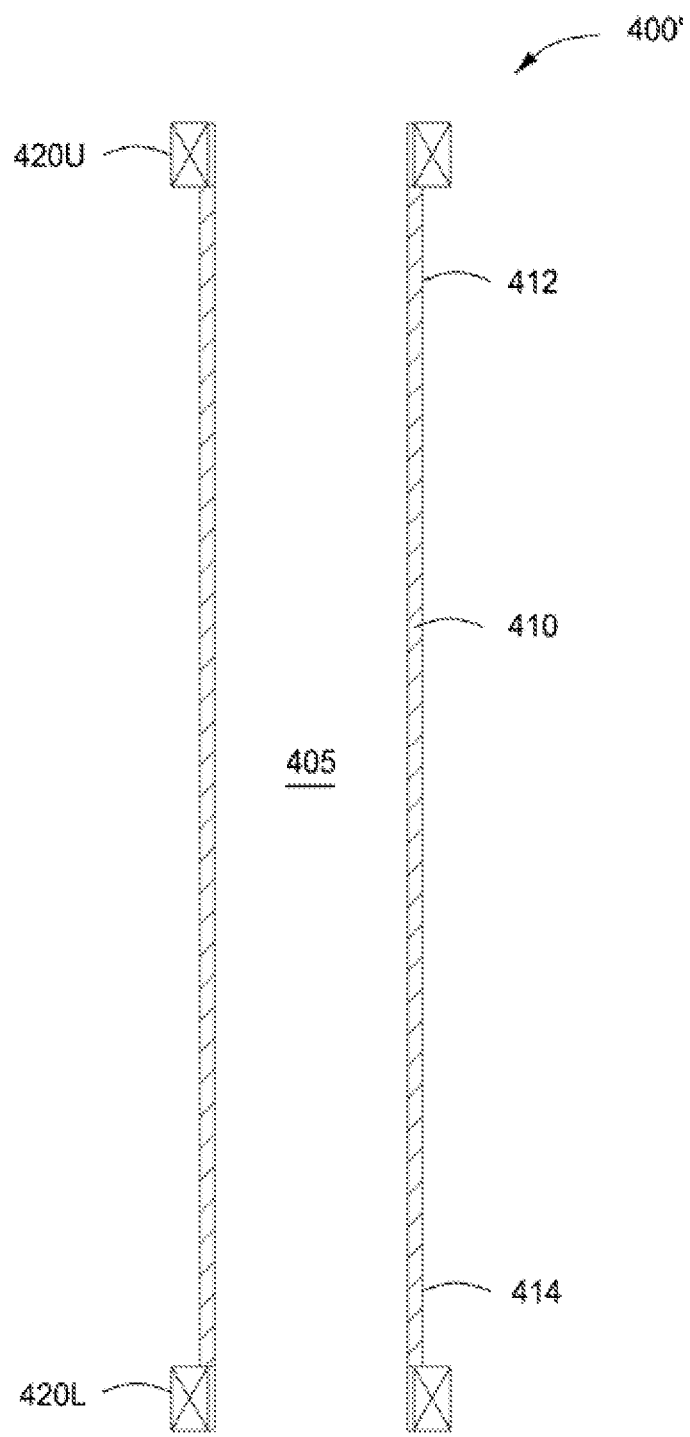
FIG. 4 is a cross-sectional side view of the straddle liner of FIG. 3C.

FIG. 4 provides an enlarged, cross-sectional side view of the straddle liner 400' of FIG. 3C. The straddle liner 400' first includes a blank liner 410. The blank liner 410 represents one or more joints of a tubular body. The blank liner is not slotted or perforated to seal out fluid communication into a bore 405 of the liner 410.

The straddle liner 400' also includes a first packer 420U. The first packer 420U resides at an upper end 412 of the blank liner 410. As seen in FIG. 3C, the first packer 420U is set adjacent a first section of blank pipe 330U so as to substantially seal an annular area 425 formed between the blank liner 410 and the surrounding first section of blank pipe 330U.

The straddle liner 400' also includes a second packer 420L. The second packer 420L resides at a lower end 414 of the blank liner 410. As seen in FIG. 3C, the second packer 420L is set adjacent a second length of blank pipe 330L so as to substantially seal the annular area 425 formed between the blank liner 410 and the surrounding second length of blank pipe 330L.

The packers 420U, 420L may be mechanical packers. More preferably, each of the first packer 420U and the second packer 420L is a swellable packer. Swellable packers are known, and include at least one swellable packer element fabricated from a swelling elastomeric material. Suitable examples of swellable materials may be found in Easy Well Solutions' CONSTRICTOR™ or SWELLPACKER™, and Swellfix's E-ZIP™. The thickness and length of the swellable packers 420U, 420L must be able to expand to the respective blank pipe sections 320U, 320L and provide the required pressure integrity at that expansion ratio. The swellable packers 42U, 420L may be fabricated from a combination of materials that swell in the presence of both water and oil, respectively. Stated another way, the swellable packer element 420U, 420L may include two types of swelling elastomers—one for water and one for oil. In this situation, the water-swellable element will swell when exposed to formation water, and the oil-based element will expand when exposed to hydrocarbon production.

Swellable elastomeric materials may include, for example, natural rubber; acrylate butadiene rubber; polyacrylate rubber; isoprene rubber; choloroprene rubber; butyl rubber; brominated butyl rubber; chlorinated butyl rubber; chlorinated polyethylene; neoprene rubber; styrene butadiene copolymer rubber; ethylene vinyl acetate copolymer; silicone rubbers; nitrile rubber; and many other swellable elastomeric materials. The swelling elastomeric material may be determined to swell in the presence of one of a conditioned drilling fluid, a completion fluid, a production fluid, an injection fluid, a stimulation fluid, or any combination thereof. However, the present inventions are not limited to the particular design of the packers 42U, 420L.

In FIG. 3C, packers 420U and 420L have been set across blank pipe sections 330U, 330L of the wellbore assembly. In addition, the presence of the straddle liner 400' with the packers 420U, 420L coupled with the blank pipe section 330 forces fluids that might otherwise pass upwards in the wellbore 300 to pass through a lengthy section of gravel pack annulus 302. It is doubtful that the fluid sees enough pressure differential to make that trip, effectively sealing the wellbore along intermediate interval 326.

The sand control devices 350 may represent a first length of sand screen along interval 324, a third length of sand screen along interval 328, and a second length of sand screen intermediate the first and third lengths of sand screen along interval 326. In one aspect, the first length of sand screen comprises at least two joints of sand screen, the second length of sand screen comprises at least two joints of sand screen, or both. In one aspect, the first length of sand screen, the second length of sand screen, and the third length of sand screen is each about 30 feet to 200 feet in length. In another aspect, the first section of blank pipe 330U and the second section of blank pipe 330L is each about five feet to 50 feet in length.

It is noted that the blank liner 410 has a length that extends substantially across the entire interval 326. In the view of FIG. 3C, the blank liner 410 only extends from the first section of the blank pipe 330U to the second section of the blank pipe 330L. However, the length of the blank liner 410 may be increased to extend above the first section of the blank pipe 310U, below the second section of the blank pipe 320L, or both.

Figure 3D:
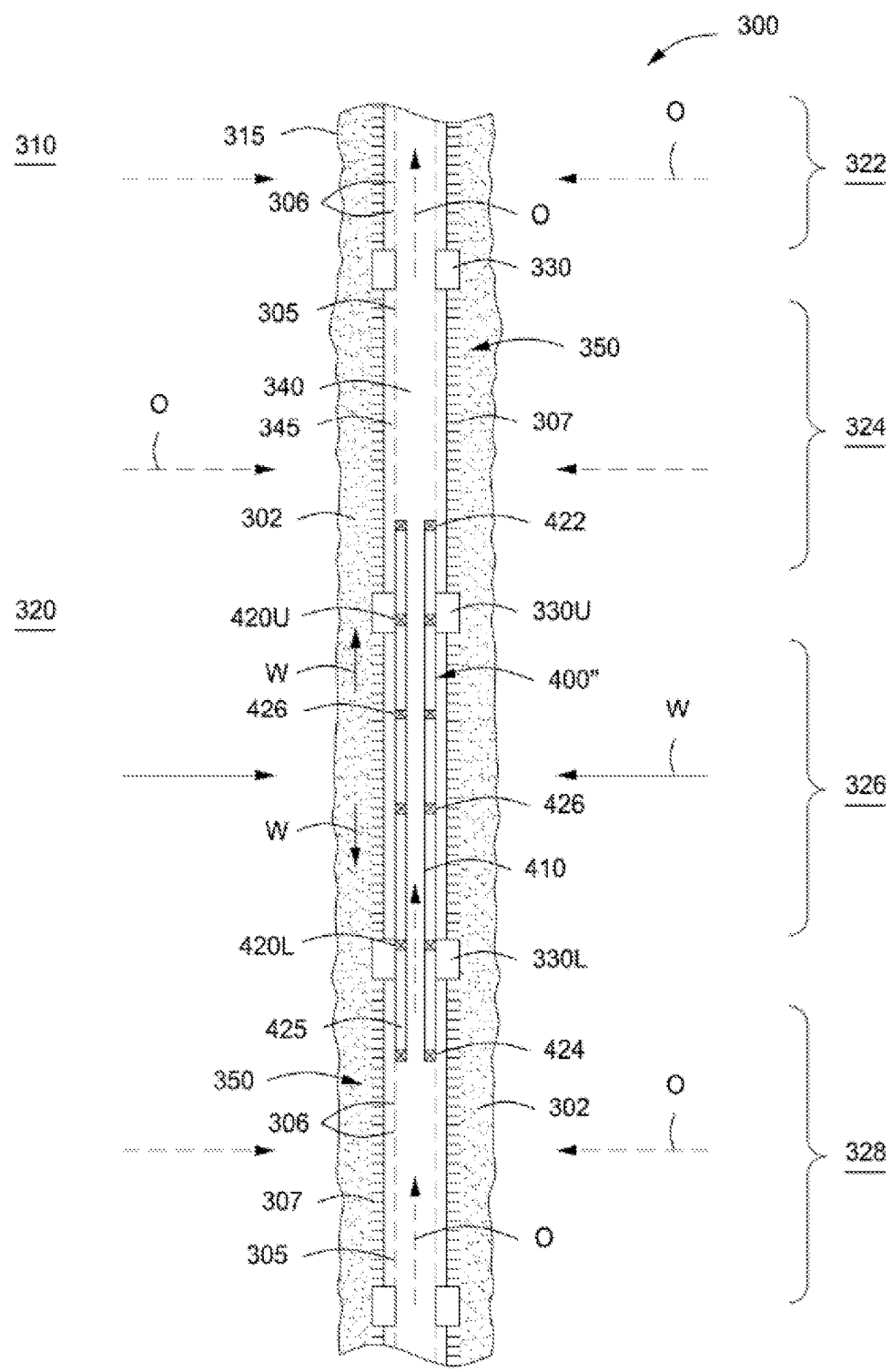
FIG. 3D is an alternate side view to the open-hole wellbore of FIG. 3C. Here, the straddle liner has multiple packers set along the intermediate interval.

FIG. 3D is an alternate side view of the open-hole wellbore of FIG. 3C. Here, a modified straddle liner 400" is employed. The modified straddle liner 400" has a length that extends both above the first section of the blank pipe 330U and below the second section of the blank pipe 330L. This provides additional resistance to the flow of non-hydrocarbon fluids "E" into the wellbore 300 intermediate the first 330U and second 330L sections of blank pipe.

An additional upper packer 422 may optionally be placed at an upper end of the blank liner 410 extending above the first section of blank liner 330U. Similarly, an additional lower packer 424 may optionally be placed at a lower end of the blank liner 410 extending below the second section of blank liner 330L. The use of the upper 422 and lower 424 packers enhances the isolation of the wellbore intermediate interval 326.

The alternative straddle liner 400" optionally utilizes one or more intermediate packers 426 set along the intermediate interval 326. These intermediate packers 426 provide further insulation against the invasion of formation fluids, particularly formation water "W," into the bore 405 of the blank liner 410. The presence of the intermediate packers 426 may beneficially reduce the preferential differential behind the upper 420U and lower 420L packers.

Figure 3E:
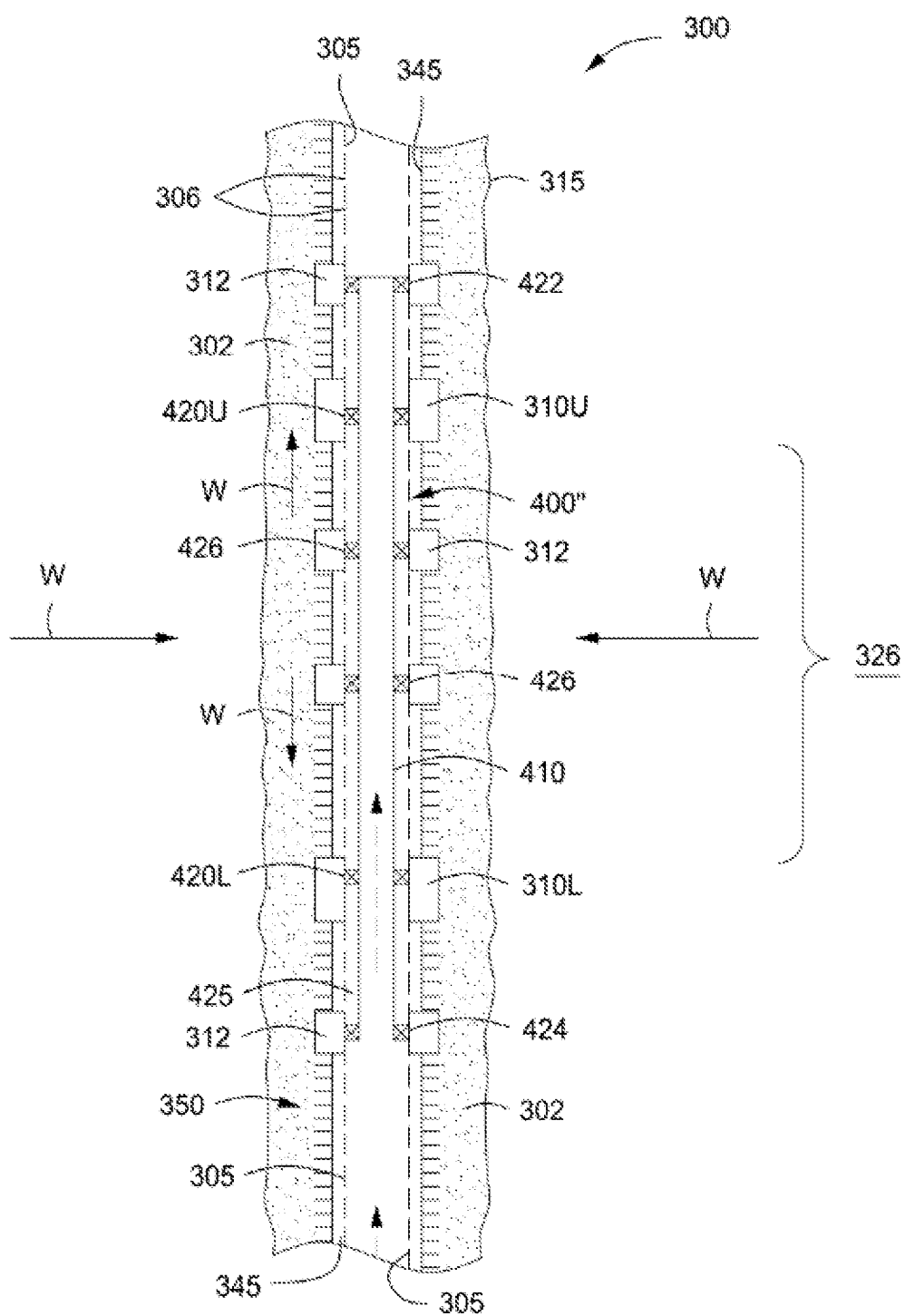
FIG. 3E is an enlarged view of the wellbore of FIG. 3D. Here, the straddle liner and associated packers are shown more clearly along the intermediate interval.

FIG. 3E presents an enlarged view of the wellbore 300 of FIG. 3D. Here, the straddle liner 400" and associated packers 422, 424, 426 are shown more clearly along the intermediate interval. The sections of blank pipe 310U, 310L straddling the intermediate interval 326 are more visible. Similarly, shorter sections of blank pipe 312 are visible. These shorter sections of blank pipe 312 are preferably connection joints that threadedly connection joints of sand screen along the wellbore 300.

In any of the embodiments described in connection with straddle liners 400', 400", the operator may isolate a selected interval such as interval 326. In this way, primarily condensable hydrocarbon fluids "O" may be produced through the wellbore 100 and to the surface 101. It is admitted that the straddle liners 400', 400" do not create a complete fluid seal of formation fluids coming in from interval 326; however, the presence of a straddle liner, such as straddle liner 400', will force the formation fluids from interval 326 to travel around the straddle liner 400' to reach the bore 405 of the straddle liner 400'. This forces the formation fluids from interval 326 to travel a more tortuous flow path and, most likely, to overcome greater pressure resistance.

The use of straddle liners 400', 400" as shown in FIGS. 3C and 3D are designed to inhibit the flow of fluids into a wellbore 300 from an upper (e.g., 322) interval or from an intermediate (e.g., 324 or 326) interval. Thus, the straddle liners 400' or 400" serve as inflow reduction devices. The straddle liners 400', 400" could also be used to restrict the flow of fluids into a wellbore 300 from a lower (e.g., 328)

interval; however, such would be unnecessarily expensive. Instead, a separate inflow reduction device may be used, as presented below.

Figure 5A:
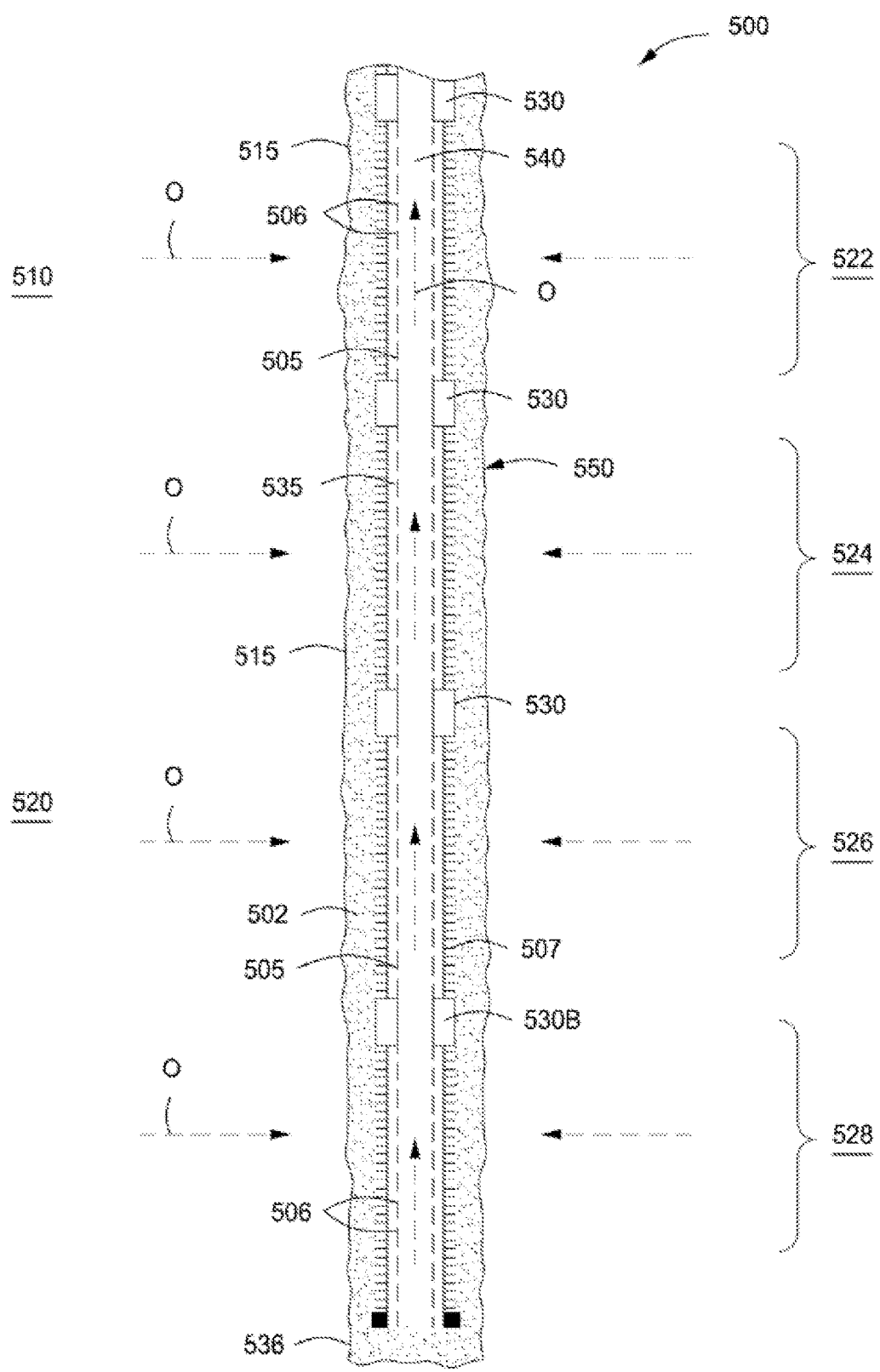
FIG. 5A is another side view of a portion of the open-hole completion of a wellbore, such as the wellbore of FIG. 2, in one embodiment. A gravel pack is again shown in cross-section running through several subsurface intervals. Hydrocarbon fluids are seen entering the wellbore for production.

FIG. 5A is a side view of a portion of an illustrative wellbore 500. The wellbore 500 represents an open-hole portion 520 at a bottom 536 of the wellbore 500. The wellbore 500 penetrates through a subsurface formation 510 and down to the open-hole portion 520. The wellbore 500 is generally constructed in accordance with wellbore 300, except that the bottom 536 of the open-hole portion 520 of the wellbore 500 is seen.

As with wellbore 300 of FIG. 3A, the wellbore 500 is completed with sand control devices 550. The sand control devices 550 comprise sand screens made up of joints of perforated base pipe 505. Pre-drilled holes are seen along the base pipe 505 at 506. The holes (or slots) 506 permit an inflow of reservoir fluids. At the same time, sections of screen or other filter medium 507 are placed around the base pipe 505 to filter out sand and other particles from the formation 510. In addition, gravel 502 is packed into an annular region formed between the filter medium 507 and a surrounding borehole wall 515.

Sections of the sand control devices 550 are separated by joints of blank pipe 530. The blank pipe 530 is generally located between subsurface intervals 522, 524, 526, 528 along the open-hole portion 520. The blank pipe 530 represents sections of tubular bodies that are not slotted or perforated.

Hydrocarbon fluids are seen entering the wellbore 500 for production. The flow of hydrocarbon fluids is shown through dashed lines "O." The hydrocarbon fluids come into the wellbore 500 from each interval 522, 524, 526, 528. Intervals 522, 524, 526, 528 again represent geologic strata comprised of sand or other permeable and at least partially unconsolidated rock matrix.

As fluids flow from the various intervals 522, 524, 526, 528 and into the wellbore 500, the fluids will migrate through the filter medium 507, through the slots, and into a bore 540 within the base pipe 505. Formation fluids will then flow up the bore 540 and to the surface 101. It is also noted that fluids may also migrate up the wellbore 500 by means of a very small annular region 545 formed between the base pipe 505 and the surrounding filter medium 507.

Figure 5B:
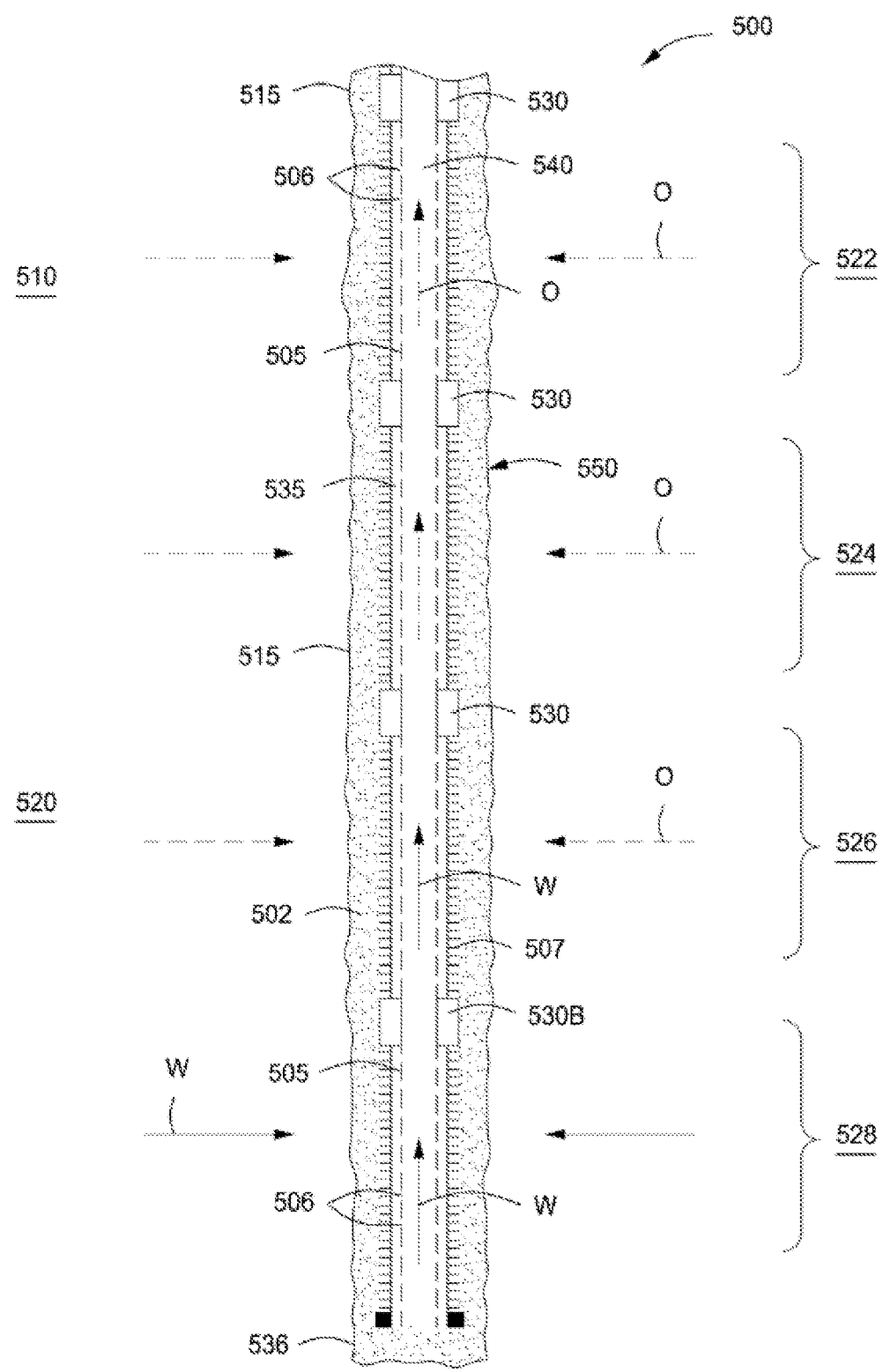
FIG. 5B is another side view of the open-hole completion of FIG. 5A. Here, a reservoir fluid that is not primarily oil has broken through to the wellbore along a lower-most subsurface interval.

FIG. 5B is another side view of the open-hole completion 520 of FIG. 5A. Hydrocarbon fluids are again seen entering the wellbore 500 for production. The flow of hydrocarbon fluids is shown through dashed lines "O." However, a reservoir fluid that is not primarily oil has broken through to the wellbore 500 along bottom subsurface interval 328. The flow of a non-hydrocarbon fluid is indicated at line "W." The reservoir fluid may be, for example, formation water, formation gas, or injected water.

The reason for the change in fluid content may be due to any of several reservoir conditions. For example, water may encroach through interval 328 due to the presence of native water zones, high permeability streaks or natural fractures in the aquifer. Fingering from injection wells may also be taking place. Alternatively, encroachment may be due to coning. Alternatively still, hydrocarbon gas encroachment may be occurring. In any instance, it is desirable to at least partially restrict the flow of the non-oil fluid "W" into the wellbore 500 through a remediation procedure that is quick and economical.

In order to provide the restriction, a new inflow reduction device is provided herein. A first embodiment of an inflow reduction device 540' is provided in FIG. 5C.

Figure 5C:
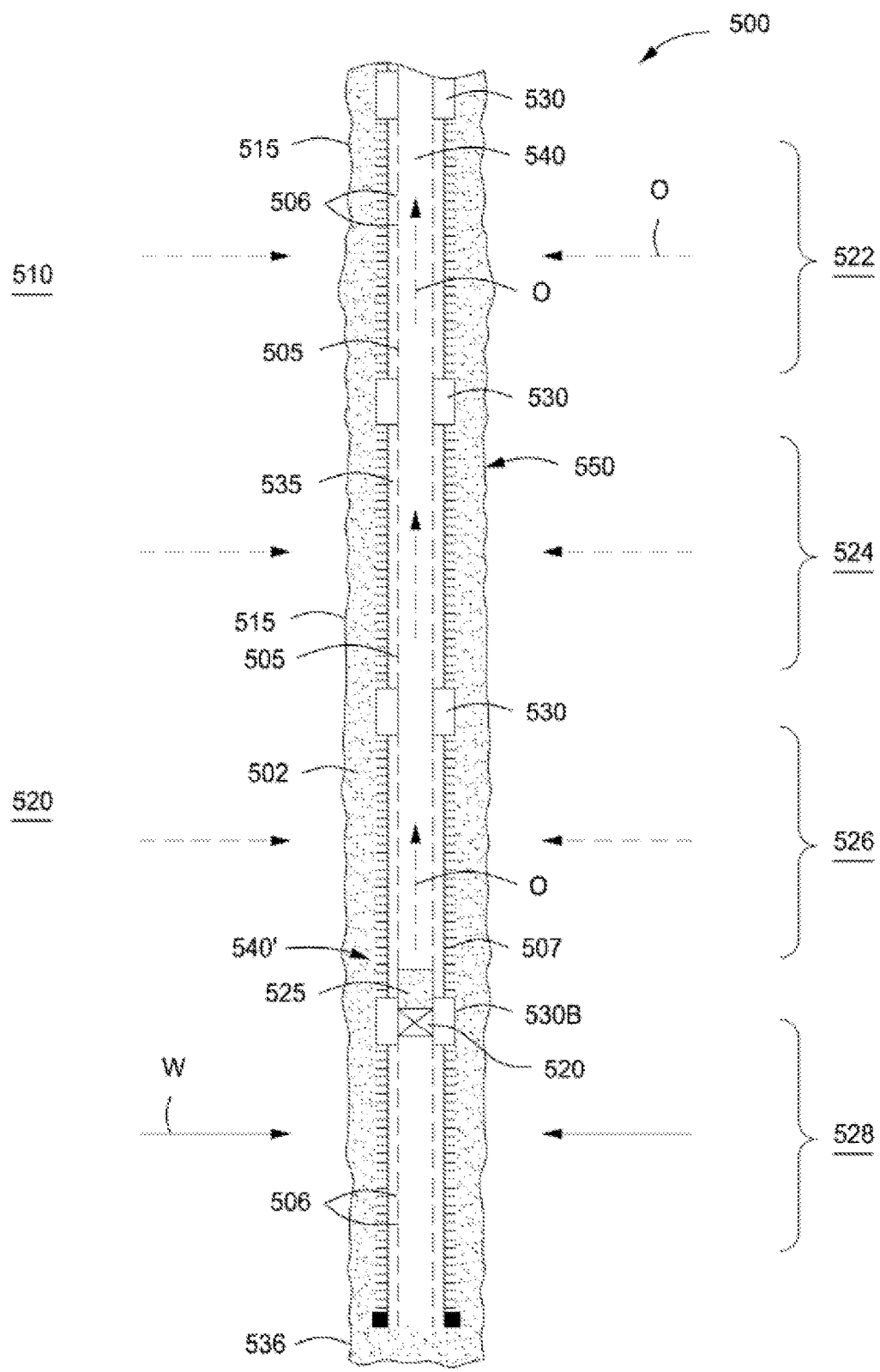
FIG. 5C is another side view of the open-hole completion of FIG. 5A. Here, an inflow reduction device has been set in the wellbore above the lower-most interval. The inflow reduction device represents a plug with a column of sand placed above the plug.

FIG. 5C is another side view of the open-hole wellbore 500 of FIG. 5A. Here, the inflow reduction device 540' has been set in the wellbore 500 above the lower-most interval 528. The inflow reduction device 540' represents a plug 520 with a column of sand 525 above the plug 520. The plug 520 is set at the level of a lower-most or bottom section of blank pipe 510B. The column of sand 525 is then placed on top of the plug 520.

The presence of the plug 520 above the lower-most interval 528 keeps formation fluids "W" from traveling up the base pipe 505. Formation fluids "W" coming from the lower-most interval 528 must travel through the gravel 502 or through the lower-most interval 528 itself up to intermediate interval 526 if the fluids "W" are to enter the base pipe 505. This substantially reduces the inflow of formation fluids "W" into the wellbore 500.

Figure 5D:
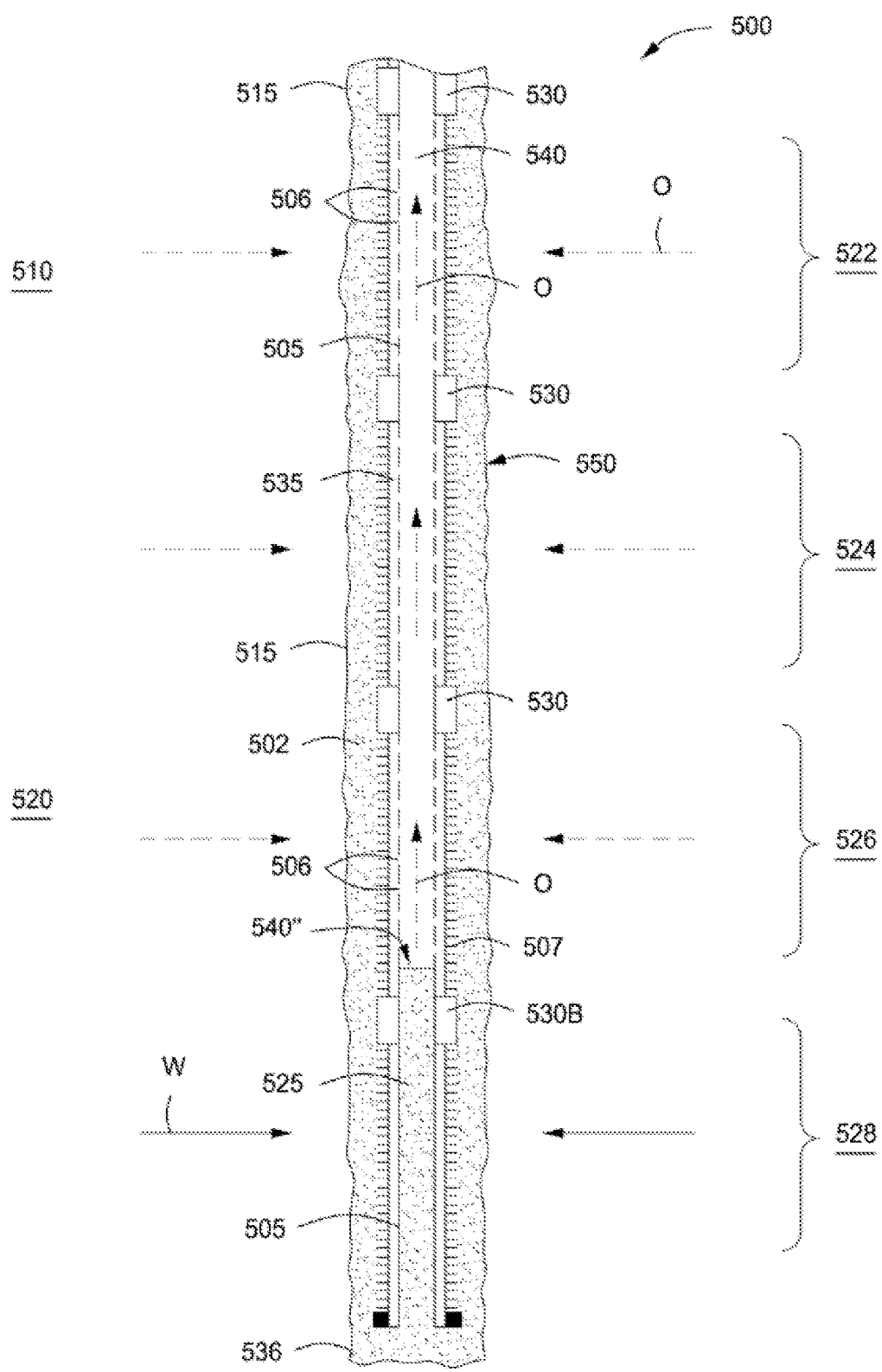
FIG. 5D is an alternate side view to the open-hole completion of FIG. 5C. Here, a column of sand has been injected across the lower-most subsurface interval.

FIG. 5D is an alternate side view to the open-hole wellbore 500 of FIG. 5C. Here, a column of sand 525 has been injected across the lower-most subsurface interval 528. The column of sand serves as an inflow reduction device 540", in an alternate embodiment. In this view, the column of sand 525 extends to a point at or above the bottom section of blank pipe 530B.

The presence of the column of sand 525 across the lower-most interval 528 keeps formation fluids "W" from freely traveling up the base pipe 505. Instead, formation fluids "W" coming from the lower-most interval 528 must travel through the gravel 502 and through the column of sand 525 to reach the base pipe 505 at the level of the intermediate interval 526. This substantially reduces the inflow of formation fluids "W" into the wellbore 500.

As can be seen, different zonal isolation apparatus and techniques are provided for a wellbore that has been previously completed as an open hole across multiple subsurface intervals. The techniques do not require the squeezing of cement or the injection of temporary plugging foams.

Figure 6:
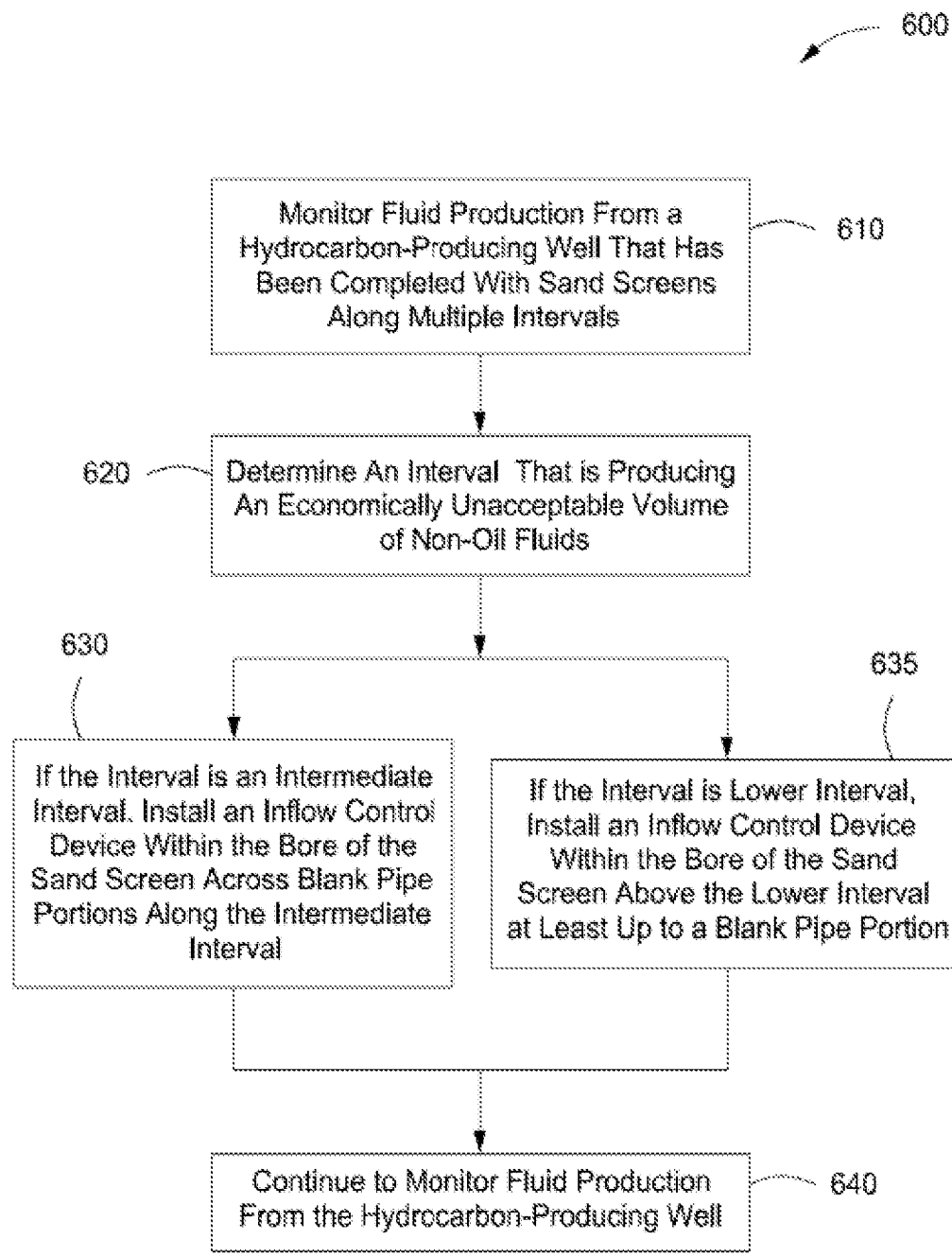
FIG. 6 is a flow chart showing steps that may be performed in connection with a method for isolating a subsurface zone along an open-hole wellbore, in one embodiment.

Methods for isolating subsurface intervals along an open-hole completion are also provided herein. FIG. 6 provides a flow chart presenting steps for a method 600 of producing fluids from a wellbore. The wellbore has been completed with a sand screen and gravel pack across multiple subsurface intervals. The method 600 involves the isolation of a selected subsurface interval.

In one aspect, the method 600 comprises monitoring fluid production from the wellbore. This is shown at Box 610. The operator is looking for variations in fluid composition. Specifically, the operator is suspicious for the presence of non-hydrocarbon fluids.

The method 600 also includes determining that a subsurface interval is producing an economically unacceptable volume of a fluid that is not a condensable hydrocarbon. Such a fluid may be, for example, formation water, injected water, methane, or some combination thereof. This is seen at Box 620.

If the interval is an intermediate interval, then the method 600 includes installing an inflow reduction device within a bore of the sand screen along the intermediate interval. More specifically, the inflow reduction device is placed across blank pipe portions along substantially an entire length of the intermediate interval. This is provided at Box 630.

The inflow reduction device may be either of straddle liners 400' or 400" described above. The straddle liners 400', 400" include a blank liner that will traverse the intermediate interval. The straddle liners 400', 400" also include at least two packers. The packers may be swellable packers, and are set across blank pipe sections of the sand screens.

In implementing the step of Box 630, the operator will need to make a determination as to the length of the blank liner to be used. In addition, the operator will need to determine the location or depth of blank pipe sections for location of the packers. One blank pipe section will be proximate a top of the intermediate interval while the other blank pipe section will be proximate a bottom of the intermediate interval.

If the interval is a lower-most interval, then the method 600 again includes installing an inflow reduction device within a bore of the sand screen. However, in this instance the inflow reduction device is placed proximate a bottom of the wellbore or at a level of a blank pipe portion just above a bottom of the wellbore. This is indicated at Box 635.

In one embodiment, the inflow reduction device is a granular material such as sand that is injected into the bottom of the wellbore substantially along an entire length of the lower-most interval. Such an inflow reduction device is shown at 540″, discussed above. Alternatively, the inflow reduction device is a plug that is set proximate a top of the lower-most interval. The plug is set across a blank pipe section of the sand screens. A column of sand is then preferably placed over the plug. Such an inflow reduction device is shown at 540′, also discussed above.

The method 600 then includes resuming monitoring fluid production from the wellbore. This is provided at Box 640. The operator or engineer monitors fluid production to determine that the volume of water, the volume of non-condensable hydrocarbon fluids, or both, has been reduced.

Figure 7:
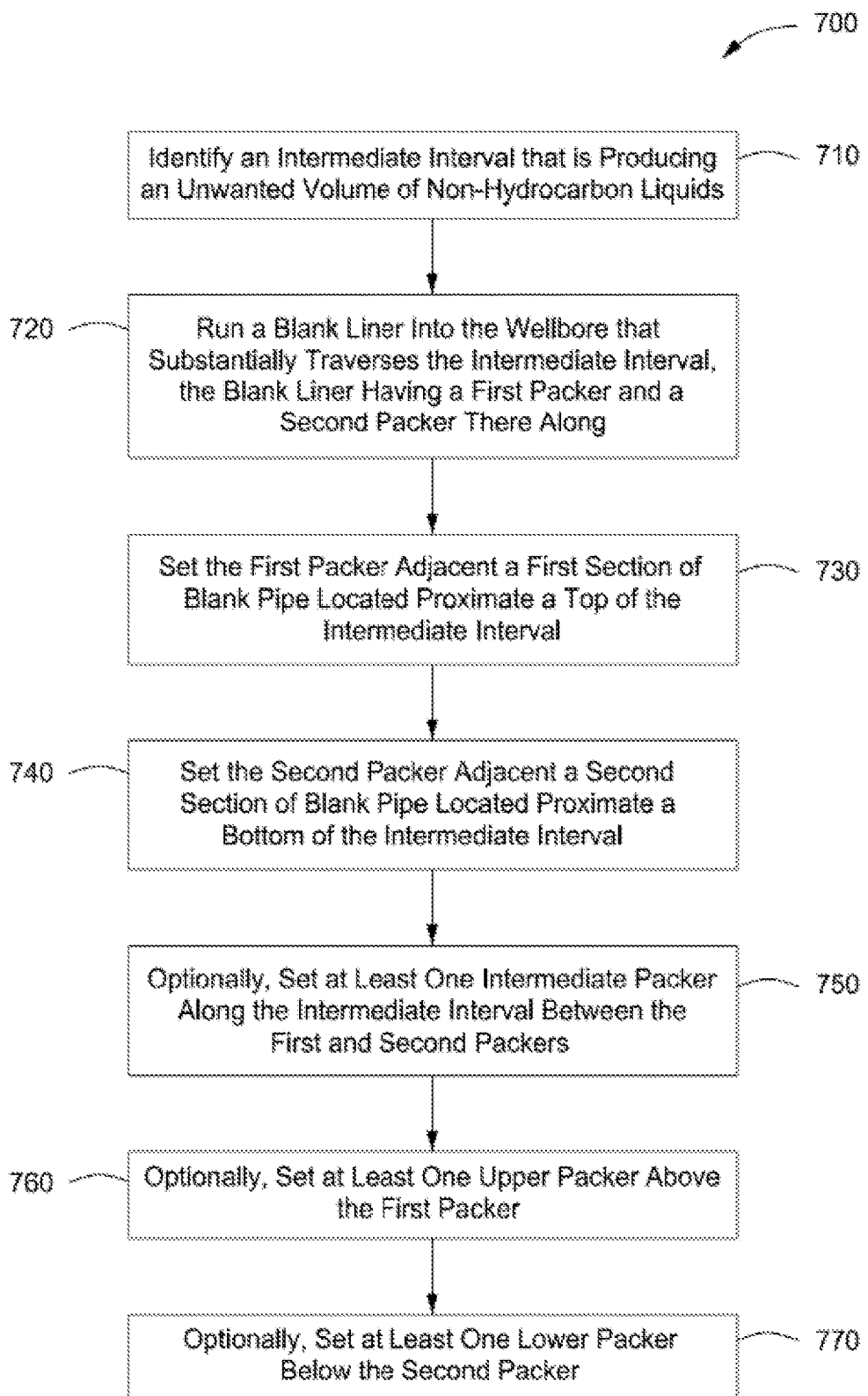
FIG. 7 another flow chart showing steps for a method for isolating a subsurface zone. The subsurface zone resides along a wellbore that has been completed to have an open-hole portion, with the open-hole portion having multiple sections of sand screen.

An alternate method for isolating a subsurface zone is provided herein. Such a method is shown at 700 in FIG. 7. FIG. 7 is a flowchart showing selected steps of the method 700, in one embodiment.

In the method 700, a wellbore has been completed to have an open-hole portion. The open-hole portion has been formed through multiple subsurface intervals. The open-hole portion includes a gravel pack having multiple sections of sand screen. Sections of blank pipe are placed intermediate sections of sand screen. The open-hole portion of the wellbore may be completed substantially vertically; alternatively, the open-hole portion may be deviated, or even horizontal.

The method 700 first includes identifying an intermediate interval that is producing an unwanted volume of non-hydrocarbon liquids. This is shown at Box 710. The non-hydrocarbon liquids may be formation water, injection water, or gas. The operator may identify such an interval through, for example, downhole sampling or by running a log to detect temperature and pressure profiles.

The method 700 next includes running a blank liner into the wellbore. This is seen at Box 720. The liner may be part of either of straddle liners 400′ or 400″ described above. The straddle liners 400′, 400″ include a blank liner that will traverse the intermediate interval. The straddle liners 400′, 400″ also include at least first and second packers.

The method 700 further includes setting the first packer and setting the second packer. These steps are provided at Boxes 730 and 740, respectively. It is preferred that the packers are swellable packers. The first packer is set across a blank pipe section of the sand screens proximate a top of the intermediate interval, while the second packer is set across a blank pipe section of the sand screens proximate a bottom of the intermediate interval. In this way, the liner generally straddles the intermediate interval. From an operational standpoint, the first packer may also be a mechanical packer which can be set immediately during installation. In this way, the mechanical packer can hold the straddle liner in place until the lower second packer swells—a process which will likely take a week or more.

In implementing the steps of Boxes 710, 720 and 730, the operator will need to make a determination as to the length of the blank liner to be used. In addition, the operator will need to determine the location or depth of blank pipe sections for location of the first and second packers. In one aspect, the operator may conduct computer-based modeling to determine the best length of the liner and the location of the packers. In one aspect, the straddle liners traverse two or more intermediate intervals as part of the step of Box 720.

The straddle liners 400′ or 400″ may employ additional packers. For instance, one or more intermediate packers may reside between the first and second packers. In this instance, the method 700 further includes setting at least one intermediate packer along the intermediate interval between the first and second packers. This optional step is shown in Box 750.

The blank liner of the straddle liners 400′ or 400″ may optionally extend above the top of the intermediate interval or below the bottom of the intermediate interval. Where the blank liner extends above the top of the intermediate interval, an upper packer may be additionally provided. In this instance, the method 700 also includes setting at least one upper packer above the first packer. This is indicated at Box 760. Where the blank liner extends below the bottom of the intermediate interval, a lower packer may be provided. In this instance, the method 700 also includes setting at least one lower packer below the second packer. This is indicated at Box 770.

In any of these options for the method 700, the operator is increasing the flow path required for reservoir fluids from the intermediate interval to enter the wellbore. This, in turn, reduces the volume of undesirable gas or water that is produced to the surface.

While it will be apparent that the inventions herein described are well calculated to achieve the benefits and advantages set forth above, it will be appreciated that the inventions are susceptible to modification, variation and change without departing from the spirit thereof. For example, as an alternative to the use of the straddle liners 400′, 400″ in the method 700 of FIG. 7, the operator may choose to set a first plug proximate a bottom of the intermediate interval, inject a column of sand above the first plug and substantially across the intermediate interval, and then set a second plug proximate a top of the intermediate interval.

Figure 8:
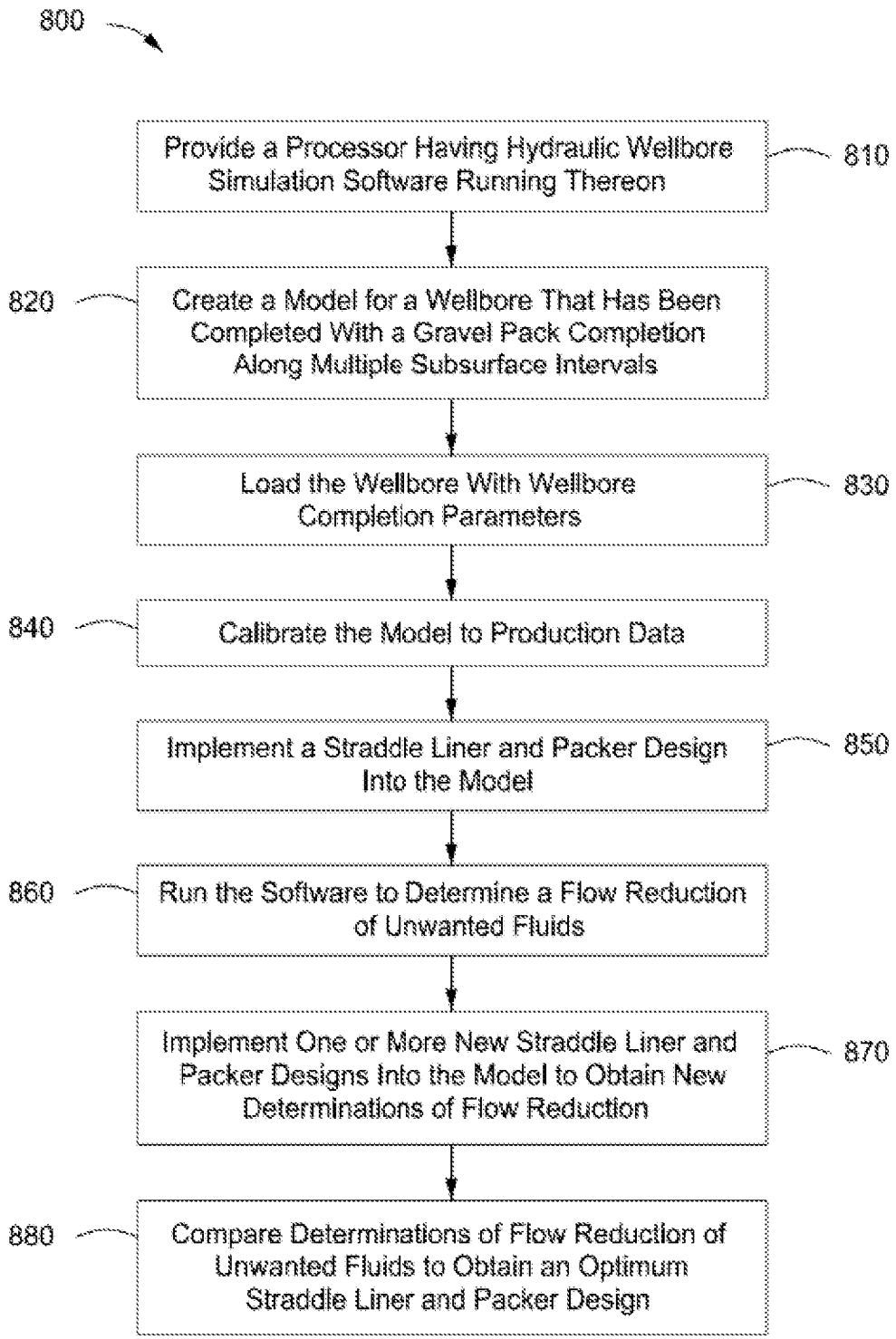
FIG. 8 is yet another flow chart, here showing steps for a method of modeling wellbore for the isolation of a subsurface zone. The modeling employs hydraulic wellbore simulation software.

It is also noted that certain parameters incident to the straddle liners 400′, 400″ may be modeled for optimal isolation of a subsurface interval. FIG. 8 provides a flow chart showing steps for a method 800 of modeling a wellbore for the isolation of a subsurface zone. The modeling employs hydraulic wellbore simulation software. The software is employed in a unique manner to determine the optimal length of straddle liner, the optimal number of packers, and ideal locations for the packers to produce reduction in unwanted inflow.

The method 800 first includes providing a processor. This is shown at Box 810. In this step, the processor is a computer having wellbore simulation software running thereon. The wellbore simulation software is designed to model a wellbore having a gravel pack completion.

The method 800 next includes creating a model. This is shown at Box 820. In this step, the model is for a wellbore that has been completed with a sand control devices and a gravel pack. The gravel pack is provided along multiple subsurface intervals, such as is shown in the FIG. 3 series herein. In addition, the model is for a wellbore that has an unwanted inflow of fluids from a subsurface interval.

The method 800 further includes loading the model with wellbore completion parameters. This is shown at Box 830. The wellbore completion parameters may include reservoir pressure, formation permeability, saturation distribution, completion diameters, and the like.

The method 800 also includes calibrating the model to production data. This is shown at Box 840. Calibrating the model means loading the model with historical production data, including various fluid cuts.

The method 800 additionally includes implementing a straddle packer and liner into the model. This is shown at Box 850. Implementing the straddle liner and packers means placing the straddle liner and packers along a subsurface interval, with the straddle liner having a dedicated length.

The method 800 then includes running the software. This is shown at Box 860. Running the software provides for a determination of flow reduction of unwanted fluids.

The method 800 next includes implementing one or more new straddle liner and packer designs into the model. This is shown at Box 870. This step allows the operator to run sensitivity analyses on the straddle liner length, its location, and the number of packers employed.

The method 800 will also include comparing determinations of flow reduction of unwanted fluids from the various liner and packer designs. This is indicated at Box 880. In this way, the operator is able to decide on an optimal straddle liner and packer design. Additional factors such as economics and feasibility of installation may be considered by the operator external to the software.

What is claimed is:

1. A zonal isolation apparatus for an open-hole wellbore, the wellbore being completed with a gravel pack having multiple sections of sand screen and with sections of blank pipe intermediate selected sections of sand screen, the apparatus comprising:
   a blank liner;
   a first packer residing along the blank liner, the first packer being set adjacent a first section of the blank pipe so as to substantially seal an annular area formed between the blank liner and surrounding sections of sand screen at the first section of blank pipe;
   a second packer residing along the blank liner, the second packer being set adjacent a second length of blank pipe so as to substantially seal the annular area formed between the blank liner and the surrounding sections of sand screen at the second length of blank pipe;
   the blank liner residing along a selected intermediate interval within the open-hole wellbore and configured to inhibit the flow of fluids into the wellbore intermediate the first and second sections of blank pipe; and
   setting a third packer within the blank liner intermediate the first and second packers, the third packer being in contact with only blank pipe between the first and second packers.

2. The zonal isolation apparatus of claim 1, wherein each of the first packer and the second packer is a swellable packer.

3. The zonal isolation apparatus of claim 1, wherein:
   the multiple sections of sand screen comprise at least a first length of sand screen, a third length of sand screen, and a second length of sand screen intermediate the first and third lengths of sand screen; and
   (i) the first length of sand screen comprises at least two joints of sand screen, (ii) the second length of sand screen comprises at least two joints of sand screen, or (iii) both.

4. The zonal isolation apparatus of claim 3, wherein:
   the first length of sand screen, the second length of sand screen, and the third length of sand screen is each about 10 feet to 200 feet in length; and
   each of the first, second and third lengths of sand screen comprises a perforated base pipe residing within a surrounding filter medium.

5. The zonal isolation apparatus of claim 4, wherein the first section of blank pipe and the second section of blank pipe is each about three feet to 50 feet in length.

6. The zonal isolation apparatus of claim 4, wherein the first packer and the second packer straddle the second length of sand screen.

7. The zonal isolation apparatus of claim 1, wherein the third packer is placed along a section of blank pipe connecting joints of sand screen.

8. The zonal isolation apparatus of claim 1, further comprising:
   a fourth packer residing along the blank liner, the fourth packer also being set intermediate the first and second packers along a section of blank pipe connecting joints of sand screen; and
   the third and fourth packers reside along the second length of sand screen intermediate the first and second sections of blank pipe.

9. The zonal isolation apparatus of claim 8, wherein:
   the zonal isolation apparatus further comprises (i) a fifth packer residing along the first length of sand screen above the first section of blank pipe, (ii) a sixth packer residing along the third length of sand screen below the second section of blank pipe, or (iii) both.

10. A method for isolating a subsurface zone along an open-hole wellbore, the wellbore being completed with a gravel pack having multiple sections of sand screen and with sections of blank pipe intermediate the respective sections of sand screen, and the method comprising:
    monitoring fluid production from the wellbore;
    determining that an intermediate interval is producing (i) an unwanted volume of water, (ii) an unwanted volume of non-condensable hydrocarbons, or (iii) both; running a blank liner into the wellbore at a depth of the intermediate interval, the blank liner having a first packer and a second packer disposed there along;
    setting the first packer adjacent a first section of the blank pipe so as to substantially seal an annular area formed between the blank liner and the surrounding first length of blank pipe;
    setting a second packer adjacent the second length of blank pipe so as to substantially seal the annular area formed between the blank liner and the surrounding second length of blank pipe, thereby inhibiting the flow of formation fluids from the intermediate interval into the wellbore; and producing hydrocarbon fluids from the wellbore; and
    setting a third packer within the blank liner intermediate the first and second packers, the third packer being in contact with only blank pipe between the first and second packers.

11. The method of claim 10, wherein:
    each of the first packer and the second packer is a swellable packer; and
    setting the first packer and setting the second packer comprises exposing the first packer and the second packer to wellbore fluids in situ for a period of time to allow the first packer and the second packer to expand.

12. The method of claim 10, wherein:
the multiple sections of sand screen comprise at least a first length of sand screen, a third length of sand screen, and a second length of sand screen intermediate the first and third lengths of sand screen;
(i) the first length of sand screen comprises at least two joints of sand screen, (ii) the second length of sand screen comprises at least two joints of sand screen, or (iii) both; and each of
the joints of sand screen comprises a perforated base pipe residing within a surrounding filter medium.

13. The method of claim 12, wherein:
the first length of sand screen, the second length of sand screen, and the third length of sand screen is each about 30 feet to 200 feet in length; and
the first section of blank pipe and the second section of blank pipe is each about five feet to 50 feet in length.

14. The method of claim 12, wherein:
the first packer and the second packer straddle the second length of sand screen; and
the method further comprises determining a length of the blank liner, determining a location for setting the first packer, and determining a location for setting the second packer so that the first packer and the second packer substantially straddle the intermediate interval.

15. The method of claim 10, wherein:
the blank liner also has a fourth packer disposed there along, with the fourth packer also residing intermediate the first and second packers within the perforated base pipe; and
the method further comprises:
setting the fourth packer.

16. The method of claim 15, wherein:
each of the third packer and the fourth packer is a swellable packer; and
setting the third packer and setting the fourth packer comprises exposing the third packer and the fourth packer to wellbore fluids in situ for a period of time to allow the third packer and the fourth packer to expand into contact with the surrounding second length of sand screen.

17. The method of claim 15, wherein:
the blank liner extends above the first section of blank pipe and above the intermediate interval;
the blank liner also has a fifth packer disposed there along, with the fifth packer residing along the first length of sand screen above the first section of blank pipe; and
the method further comprises:
setting the fifth packer.

18. The method of claim 15, wherein:
the blank liner extends below the second section of blank pipe and below the intermediate interval;
the blank liner also has a sixth packer disposed there along, with the sixth packer residing along the third length of sand screen below the second section of blank pipe; and
the method further comprises:
setting the sixth packer.

19. A method for producing fluids from a wellbore that has been completed with a sand screen and gravel pack across multiple subsurface intervals, comprising:
monitoring fluid production from the wellbore determining that a subsurface interval is producing an economically unacceptable volume of water, non-condensable hydrocarbon fluids, or both;
(i) if the interval is an intermediate interval, installing a straddle liner within a bore of the sand screen across blank pipe portions and along substantially an entire length of the intermediate interval, or (ii) if the interval is a lower-most interval, installing a column of sand within a bore of the sand screen at a lower-most blank pipe portion; and
resuming monitoring fluid production from the wellbore to determine that the volume of water, the volume of non-condensable hydrocarbon fluids, or both, has been reduced;
wherein the straddle liner comprises;
a blank liner;
a first packer residing along the blank liner, the first packer being set adjacent a first section of blank pipe so as to substantially seal an annular area formed between the blank liner and the surrounding sections of sand screen at the first section of blank pipe;
a second packer residing along the blank liner, the second packer being set adjacent a second section of blank pipe so as to substantially seal the annular area formed between the blank liner and the surrounding sections of sand screen at the second length of blank pipe; and
setting a third packer within the blank liner intermediate the first and second packers, the third packer being in contact with only blank pipe between the first and second packers thereby inhibiting the flow of fluids into the wellbore intermediate the first and second sections of blank pipe.

20. The method of claim 19, wherein each of the first packer and the second packer is a swellable packer.

21. The method of claim 19, wherein the first packer is a mechanically set packer.

22. The method of claim 19, wherein the column of sand is placed from a bottom of the wellbore up to the lower-most blank liner.

* * * * *